(12) United States Patent
Lee et al.

(10) Patent No.: US 7,420,058 B2
(45) Date of Patent: Sep. 2, 2008

(54) COMPOUND FOR MOLECULAR ELECTRONIC DEVICE HAVING THIOL ANCHORING GROUP, METHOD OF SYNTHESIZING THE COMPOUND, AND MOLECULAR ELECTRONIC DEVICE HAVING MOLECULAR ACTIVE LAYER OBTAINED FROM THE COMPOUND

(75) Inventors: Hyo Young Lee, Daejeon (KR); Jung Hyun Lee, Gyeonggi-do (KR); Gyeong Sook Bang, Jeollabuk-do (KR); Nak Jin Choi, Daegu (KR); Jong Hyurk Park, Daegu (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/602,982

(22) Filed: Nov. 22, 2006

(65) Prior Publication Data

US 2007/0120121 A1    May 31, 2007

(30) Foreign Application Priority Data

Nov. 28, 2005  (KR) ...................... 10-2005-0114197
Feb. 24, 2006  (KR) ...................... 10-2006-0018435

(51) Int. Cl.
  *C07D 401/14*   (2006.01)
  *C07F 15/00*    (2006.01)
  *H05B 33/14*    (2006.01)

(52) U.S. Cl. .......................... 546/2; 502/223; 502/200; 502/167; 428/689; 428/690; 428/917

(58) Field of Classification Search ...................... 546/2; 428/690, 917, 689; 313/506; 502/207, 223, 502/200, 167
See application file for complete search history.

(56) References Cited

U.S. PATENT DOCUMENTS 6,433,270 B1    8/2002   Rack
2003/0144513 A1    7/2003   Islam et al.

FOREIGN PATENT DOCUMENTS

JP    08217812 A    *    8/1996

KR    1020040014020    2/2004

OTHER PUBLICATIONS

Chao Li et al.; "Charge Storage Behavior of Nanowire Transistors Functionalized with Bis(terpyridine)-Fe(II) Molecules: Dependence on Molecular Structure"; J.Am. Chem.Soc. 2004, vol. 126; pp. 7750-7751.

* cited by examiner

*Primary Examiner*—Charanjit S. Aulakh
(74) *Attorney, Agent, or Firm*—Lowe Hauptman Ham & Berner LLP

(57) ABSTRACT

Provided are a compound for a molecular electronic device which includes a terpyridine-ruthenium organic metal compound including a thiol anchoring group of the formula below, a method of synthesizing the compound and a molecular electronic device including a molecular active layer obtained from the compound.

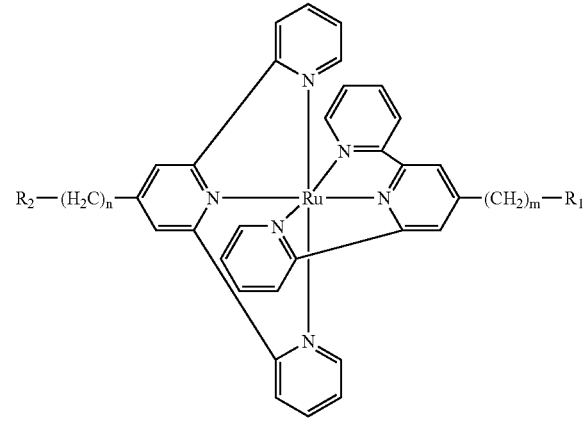

In the formula, $R_1$ and $R_2$ are each a thioacetyl group or a hydrogen atom, at least one of $R_1$ and $R_2$ is a thioacetyl group, and m and n are each integers from 0 to 20. The molecular active layer, which is formed by self-assembling the compound on an electrode surface, composes a switching element and a memory element.

12 Claims, 18 Drawing Sheets

COMPOUND FOR MOLECULAR ELECTRONIC DEVICE HAVING THIOL ANCHORING GROUP, METHOD OF SYNTHESIZING THE COMPOUND, AND MOLECULAR ELECTRONIC DEVICE HAVING MOLECULAR ACTIVE LAYER OBTAINED FROM THE COMPOUND

CROSS-REFERENCE TO RELATED PATENT APPLICATION

This application claims the benefit of Korean Patent Application No. 10-2005-0114197, filed on Nov. 28, 2005 and No. 10-2006-0018435, filed on Feb. 24, 2006, in the Korean Intellectual Property Office, the disclosures of which are incorporated herein in their entirety by reference.

BACKGROUND OF THE INVENTION

1. Field of the Invention

The present invention relates to a compound including a functional group in which electric characteristics can be provided, a method of synthesizing the compound, and a molecular electronic device obtained from the compound, and more particularly, to a compound for a molecular electronic device including a thiol anchoring group, a method of synthesizing the compound, and a molecular electronic device including a molecular active layer obtained from the compound.

2. Description of the Related Art

Recently, as developing of the information industry, computer chips, which play the most important role for information storage, have become more highly integrated. Due to various integration techniques, semiconductor devices have arrived at a limit of performance improvement due to increased production costs and physical limits. Efforts have been made to implement devices using molecules to overcome this limit.

A single molecular layer can be formed on an electrode of an electronic device. To date, molecule self-assembling methods and Langmuir-Blodgett methods are known as methods of forming a single molecular layer. Among these, to use the molecule self-assembling methods, it is necessary that a thiol group or a functional group having reactivity similar to reactivity of a thiol group be positioned at an end of molecules for reacting with gold electrodes that are generally much used. Based on these principles, it has been reported that memory devices, which include a single molecular layer formed on gold electrodes using self-assembling methods using phenylene acetylene oligomer, are formed (for example, M. A. Reed, J. Chen, A. M. Rawlett, D. W. Price, J. M. Tour, *Appl. Phys. Lett.*, 78 (2001), 3735). However, electric shorts caused by defects of the molecular device may occur in a self-assembled film of the molecular device using the self-assembling methods.

Research has been conducted into the commercialization of semiconductor products on the scale of several tens of nanometers. However, materials for molecular electronic devices having a novel structure, in which excellent device properties can be provided according to device function, wherein problems such as electric shorts do not occur in very ultra slim and fine molecular electronic devices, are required.

SUMMARY OF THE INVENTION

The present invention provides a compound for a molecular electronic device having a novel structure, which can be properly applied to implement a molecular electronic device on the scale of several nanometers.

The present invention provides a method of synthesizing the compound for a molecular electronic device having a novel structure, which can be property applied to implement a molecular electronic on the scale of several nanometers.

The present invention provides a nano-sized molecular electronic device having an ultra slim and fine structure on the scale of several nanometers by providing excellent memory characteristics and switching characteristics from a molecular active layer including a single molecular layer.

According to an aspect of the present invention, there is provided a compound for a molecular electronic device including a structure of the formula below:

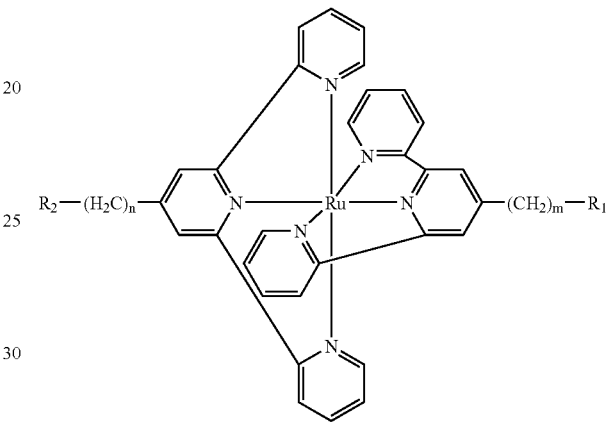

where $R_1$ and $R_2$ are independently a thioacetyl group or a hydrogen atom, at least one of $R_1$ and $R_2$ is a thioacetyl group, and m and n are independently integer from 0 to 20.

According to another aspect of the present invention, there is provided a method of synthesizing the compound for the molecular electronic device, the method including: preparing a first terpyridine compound including a thioacetyl group from 4'-methylthiolterpyridine or 4'-methylterpyridine; and reacting the first terpyridine compound and rutheniumtrichloride hydrate to synthesize the compound as described above.

The preparing the first terpyridine compound may include reacting 4'-methylthiolterpyridine and potassiumthioacetate.

The preparing the first terpyridine compound may include: lithiating a methyl group from 4'-methylterpyridine; reacting the lithiated resultant material and bromoalkane and to form bromoalkylterpyridine; and reacting the bromoalkylterpyridine and the potassiumthioacetate.

According to another aspect of the present invention, there is provided a method of synthesizing the compound for the molecular electronic device, the method including: forming a first terpyridine compound including a thioacetyl group from 4'-methylthiolterpyridine or 4'-methylterpyridine; reacting a second terpyridine compound and rutheniumtrichloride hydrate to form terpyridineruthenium trichloride; and reacting the terpyridineruthenium trichloride and the first terpyridine compound to synthesize the compound as described above.

According to another aspect of the present invention, there is provided a molecular electronic device including: a first electrode; a second electrode formed on the first electrode; and a molecular active layer interposed between the first electrode and the second electrode, and wherein the molecular active layer includes the compound for molecular electronic device as described above self-assembled on the first electrode.

According to another aspect of the present invention, there is provided the molecular electronic, wherein the molecular active layer composes a switching element which is mutually switchable on states of ON and OFF according to voltages applied between the first electrode and the second electrode.

The molecular active layer may compose a memory element in which a predetermined electric signal is stored according to voltages applied between the first electrode and the second electrode.

The molecular active layer may be self-assembled on the first electrode using a thiol group of the compound for molecular electronic device as an anchoring group.

According to the molecular electronic device of the present invention which includes a molecular active layer interposed between two electrodes, memory characteristics and switching characteristics are provided. A compound according to the present invention can be self-assembled on a metal electrode to form a single molecular layer, and thus a molecular electronic device on the scale of several tens of nanometers may be formed.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A novel compound for a molecular electronic device having switching characteristics and memory characteristics and a method of synthesizing the same are provided according to embodiments of the present invention. The compound for the molecular electronic device according to an embodiment of the present invention includes derivatives having a structure of electron acceptors-transition elements-electron donors-ligands (terpyridine thiol) by which switching characteristics and memory characteristics can be provided. The compound according to the current embodiment of the present invention includes ruthenium transition elements as electron acceptors, and a terpyridine alkylthio acetate group as electron donors. Electron acceptors and electron donors are bonded by coordinate covalent bonds between transition elements and ligands.

In addition, the compound for the molecular electronic device according to the current embodiment of the present invention includes a specific functional group (alligator clip) selectively coupled with a gold electrode using immobilization techniques, i.e. self-assembling methods, in which organic molecules included in a molecular active layer can be arranged into a single molecular layer so as to achieve a functionality. Here, an example of the specific functional group is a functional group such as alkylthiol selectively coupled with a gold electrode. Accordingly, the compound according to the current embodiment of the present invention includes a thioacetyl group as electron donors. The thickness of the molecular active layer can be regulated by adjusting the number of carbon in an alkyl group included in a terpyridine-based group according to the objective length of an alkyl chain to prevent as much as possible electric shorts which may be caused by molecular defects occurring using the self-assembling methods. An organic metal compound according to an embodiment of the present invention can be self-assembled on a metal electrode, and thus a single layer is formed on the metal electrode to obtain a molecular electronic device having a structure of metal electrode-organic film-metal electrode.

Figure 1:
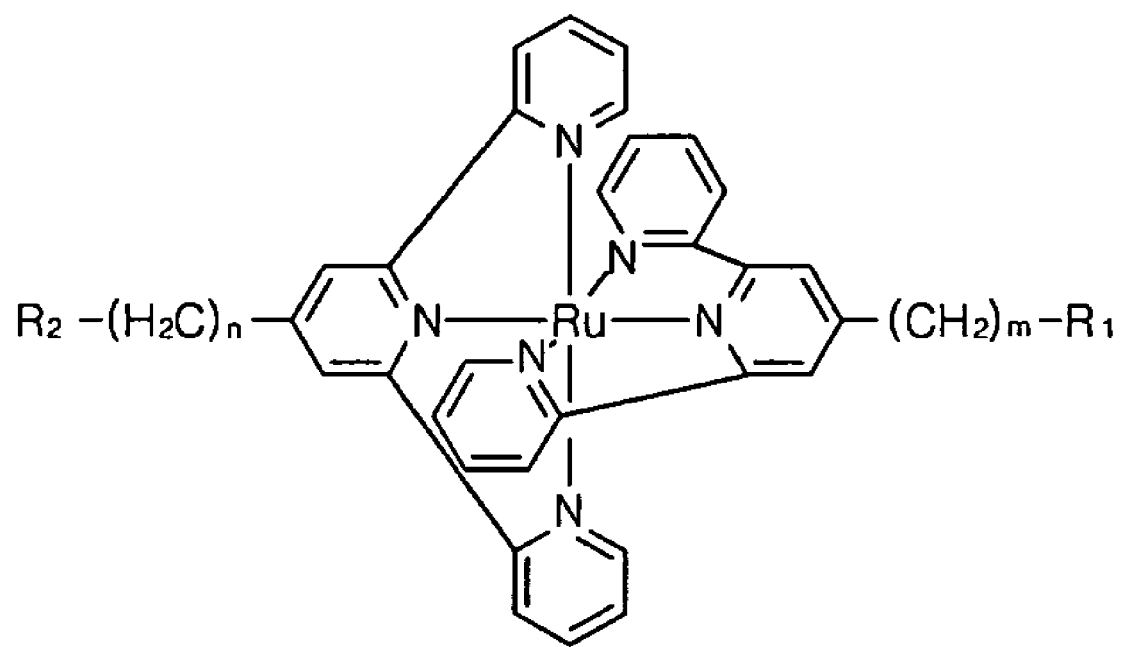
FIG. 1 is a formula illustrating a structure of a compound for electronic devices according to an embodiment of the present invention.

FIG. 1 is a formula illustrating a structure of a terpyridine-ruthenium organic metal compound for electronic devices according to an embodiment of the present invention.

In FIG. 1, $R_1$ and $R_2$ are each a thioacetyl group or a hydrogen atom, at least one of $R_1$ and $R_2$ is a thioacetyl group, and m and n are each integers from 0 to 20.

Referring to FIG. 1, the terpyridine-ruthenium organic metal compound according to the current embodiment of the present invention includes terpyridine-ruthenium [II]-4'-alkylthioacetylterpyridine or bis(4'-alkylthioacetylterpyridine)-ruthenium [II] derivatives.

The terpyridine-ruthenium organic metal compound of FIG. 1 according to the current embodiment of the present invention is immobilized on a metal electrode using self-assembling methods to form a single molecular layer. A molecular electronic device having a structure of metal electrode-organic film-metal electrode is obtained by forming an upper electrode on the single molecular layer. The molecular electronic device includes the molecular active layer having at least one organic film arranged between a pair of electrodes, according to an embodiment of the present invention. The molecular active layer includes ruthenium transition elements as electron acceptors and a terpyridinealkylthio acetate group as electron donors.

In the molecular electronic device according to the current embodiment of the present invention, an intensity of current flowing along the alkyl chain lengthwise can be controlled by adjusting properly a length of alkyl chain of organic metal compound included in the molecular active layer. In addition, n is controlled so as to prevent as much as possible electric shorts which may occur when manufacturing the molecular electronic device using the self-assembling methods with molecules. As n is greater, the thickness of the molecular active layer is further increased. Thus, a possibility of electric shorts in the molecular electronic device is reduced. However, when n is too big, for example, when n is greater than 20, solubility in organic solvents of the compound according to the current embodiment of the present invention is lowered. This fact may be a disadvantage when manufacturing the molecular electronic device according to the current embodiment of the present invention.

Figure 2:
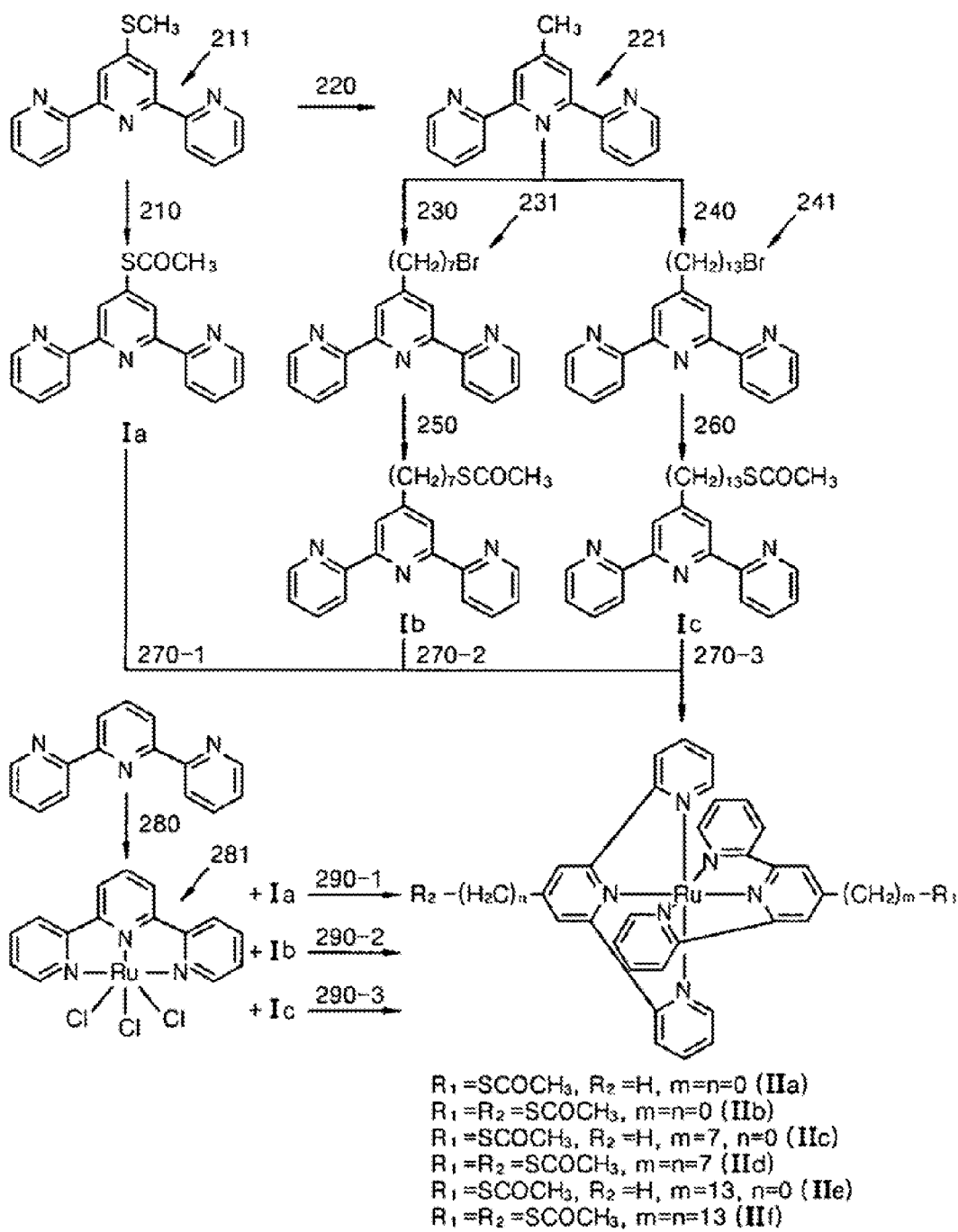
FIG. 2 is a chemical scheme for illustrating a process of synthesizing compounds for electronic devices according to various embodiments of the present invention.

FIG. 2 is a chemical scheme illustrating processes of synthesizing terpyridine-ruthenium organic metal compounds according to various embodiments of the present invention.

In a method of synthesizing a compound for a molecular electronic device according to an embodiment of the present invention, to synthesize a terpyridine compound having a thiol group, a 4'-methylthiolterpyridine compound is synthesized using a reported method (K. T. Poftas, D. A. Usifer, A. Guadalupe, H. D. Abruna, *J. Am. Chem. Soc.*, 109 (2001), 3961) which is known to those of ordinary skill in the art. Next, the 4'-methylthiolterpyridine compound is reacted with potassiumthioacetate to synthesize a novel compound Ia (referred to a synthesizing operation 210 in FIG. 2).

Adjusting a length of an alkyl chain indicated as —$(CH_2)_n$— (n is an integer) included in the above molecule is essential to immobilize the molecule on a gold electrode using self-assembling methods without any defects. With respect to a synthesizing operation according to an embodiment of the present invention, the synthesizing operation in FIG. 2 is used to adjusting the length of alkyl chain included in the compounds. First, the 4'-methylterpyridine compound reacts with a lithium tetramethyl piperidine compound to lithiate a methyl group. The obtained resultant material is reacted with 1,6-dibromohexane to synthesize an intermediate compound 231 (referring to a synthesizing operation 230 in FIG. 2), and react with 1,12-dibromododecane to synthesize an intermediate compound 241 (referring to a synthesizing operation 230 in FIG. 2). These synthesizing operations are so sensitive of water, air, etc. that close attention is needed. Bromine bound to the intermediate compounds 231 and 241 is important so that a terpyridine compound may include a thioacetyl group. Accordingly, it is essential that the lithiation compound be added dropwise slowly under a low temperature (less than −70☐) when the lithiation compound is applied. A sufficient reaction time should be set because a reaction rate is slow. Synthesized intermediate compounds 231 and 241 are each reacted with potassium thioacetate to synthesize novel terpyridine compounds Ib and Ic including a thiol derivative. The synthesized novel terpyridine compounds are refined using column chromatography, and verified using a nuclear magnetic resonance spectrometer ($^1$H-, $^{13}$C-NMR) and mass spectrograph.

To synthesize terpyridine-ruthenium compounds IIa, IIb, IIc, IId, IIe and IIf, methods as shown in FIG. 2 may be used. One of these methods is that a terpyridine compound is reacted with rutheniumtrichloride hydrate to synthesize a compound 281 which is trivalent ruthenium compound (which is referred to a synthesizing operation 280 in FIG. 2), and the resultant material from these operations is reacted with the terpyridine compound including a thioacetyl group of compounds Ia, Ib or Ic. Other methods involve reacting compounds Ia, Ib or Ic with 0.5 equivalent of rutheniumtrichloride hydrate. The organic metal compounds as illustrated in FIG. 2 according to the current embodiments of the present invention are very insensitive compounds to water and air.

Detailed descriptions of a specific synthesizing operation of compounds for a molecular electronic device according to an embodiment of the present invention will be described later.

In addition, the compound according to an embodiment of the present invention is immobilized on a lower electrode using self-assembling methods to form a single layer of molecular layer. An upper electrode is formed on the molecular layer to form a molecular electronic device according to the present invention. That is, the molecular electronic device according to an embodiment of the present invention includes a molecular active layer having at least one organic film arranged between a pair of electrodes. The molecular active layer is obtained from the organic metal compound including ruthenium transition elements as electron acceptors and a terpyridinealkylthio acetate group as electron donors.

Figure 3:
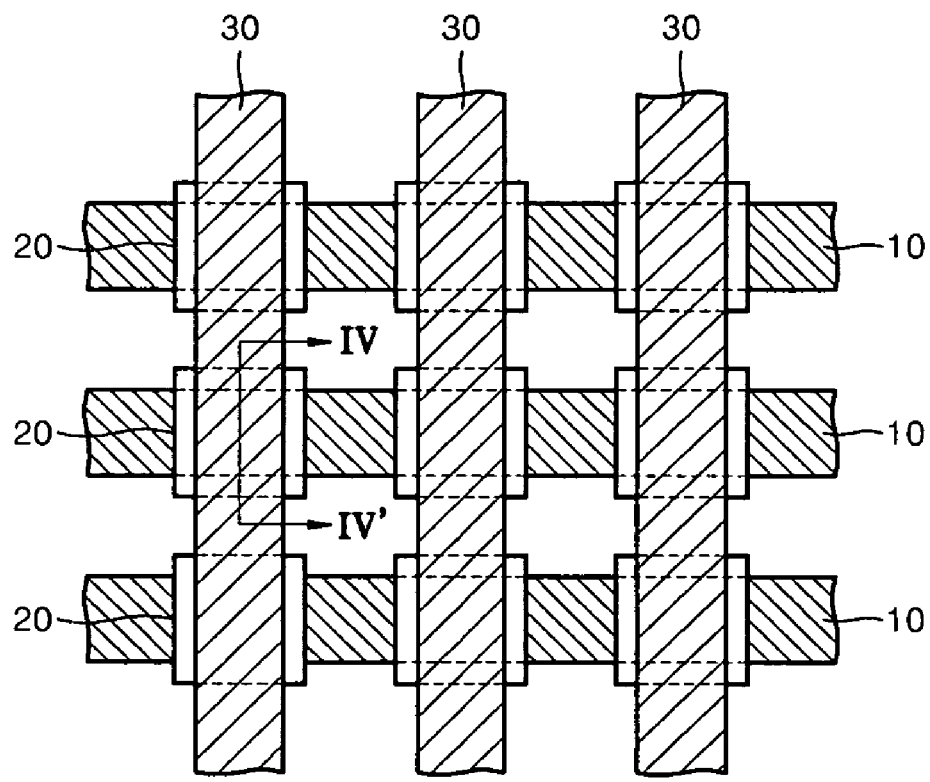
FIG. 3 is a schematic layout illustrating a molecular electronic device according to an embodiment of the present invention.
Figure 4:
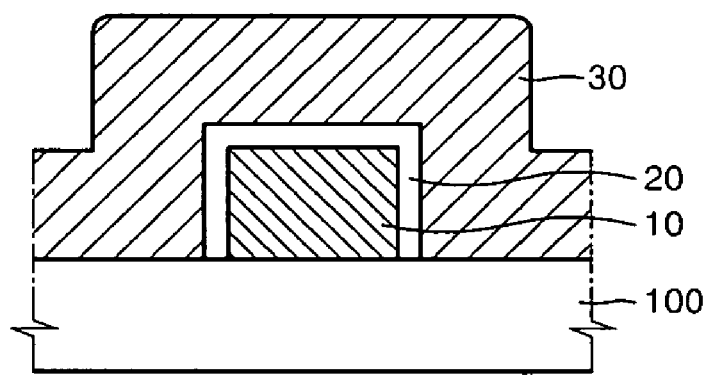
FIG. 4 is a cross-sectional view of the molecular electronic device taken along a line IV-IV' of FIG. 3, according to an embodiment of the present invention.

FIG. 3 is a schematic layout illustrating a molecular electronic device according to an embodiment of the present invention. Referring to FIG. 3, the molecular electronic device includes plurality of lower electrodes 10 and a plurality of upper electrodes 30 arranged in 3×3 arrays. FIG. 4 is a cross-sectional view of the molecular electronic device taken along a line IV-IV' of FIG. 3, according to an embodiment of the present invention.

Referring to FIGS. 3 and 4, the lower electrodes 10 and the upper electrodes 30 extend in directions perpendicular to each other so as to cross at a predetermined point on a substrate 100. A molecular active layer 20 is interposed between each of the lower electrodes 10 and upper electrodes 30. The molecular active layer 20 includes the compounds according to an embodiment of the present invention as described above. The thiol derivative of the compounds according to an embodiment of the present invention acts as a specific functional group (alligator clip) which may be self-assembled on the lower electrodes 10. That is, the compounds according to an embodiment of the present invention are selectively coupled on the lower electrode 10 with the thiol derivative as an anchoring group using self-assembling methods to form a molecular layer on the lower electrodes 10. The thickness of the molecular layer included in the molecular active layer 20 can be regulated by setting a length of alkyl chain of compound included in the molecular layer, i.e. the length of the chain is n of compounds IIa, IIb, IIc, IId, IIe and IIf in FIG. 2, to a predetermined value. The lower electrodes 10 and the upper electrodes 30 may each include gold, platinum, silver or chromium.

To manufacture the molecular electronic device according to the current embodiment of the present invention as illustrated in FIGS. 3 and 4, first, the lower electrodes 10 composed of a plurality of line patterns may be formed on the substrate 100. The lower electrodes 10 may be formed using, for example, nanoimprint technologies. To form a molecular layer including the compound according to an embodiment of the present invention on the surface of the lower electrodes 10, immobilization using self-assembling methods may be used. That is, to form the molecular layer including the compound according to an embodiment of the present invention on the surface of the lower electrodes 10, the substrate 100, on which the lower electrodes 10 are formed, is dipped into solvents, in which the compound according to an embodiment of the present invention is dissolved. Here, an anhydrous and anoxic N,N-dimethylformamide (DMF) may be used as a representative solvent suitable for dissolving the compound. For example, the substrate 100, on which the lower electrodes 10 are formed, is dipped for about 24 hours into DMF solvents in which the compound according to an embodiment of the present invention is dissolved with a molarity of 1 mmol. The molecular active layer 20 is formed to be a single molecular layer on the surface of the lower electrodes using self-assembling methods. Next, the substrate 100 including the lower electrodes 10, on which the molecular active layer 20 is formed, is washed and vacuum dried. The upper electrodes 30 may be deposited on the molecular active layer 20.

Figure 5:
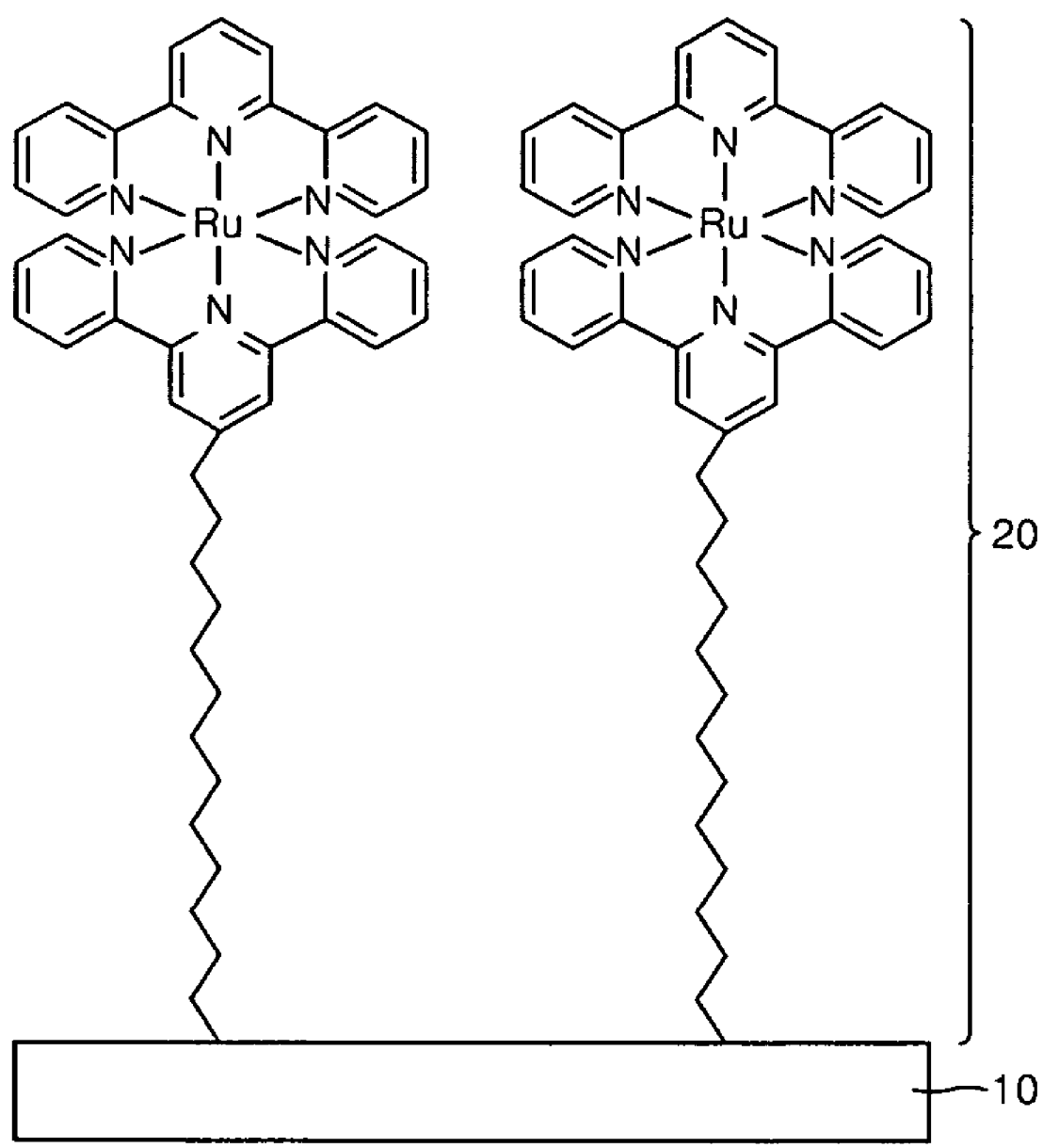
FIG. 5 is a view illustrating a structure of a molecular active layer self-assembled on a lower electrode of a molecular electronic device according to an embodiment of the present invention.

FIG. 5 is a view illustrating a structure of the molecular active layer 20 self-assembled on one of the lower electrodes 10, according to an embodiment of the present invention.

The molecular electronic device according to an embodiment of the present invention as described above may compose a switching element which is mutually switchable on states of ON and OFF. The molecular electronic device according to an embodiment of the present invention may also compose a memory device in which predetermined electric signals are stored according to voltages applied between the lower electrodes 10 and the upper electrodes 30.

While the structures as illustrated in FIGS. 3 and 4 have been particularly shown and described with reference to exemplary embodiments of the present invention, it will be understood by those of ordinary skill in the art that various changes in the structure of the molecular electronic device and the method of manufacturing thereof may be made therein without departing from the spirit and scope of the present invention.

Hereinafter, a method of synthesizing the compound for molecular electronic devices according to an embodiment of the present invention will be described in greater detail with reference to FIG. 2.

EXAMPLE 1

Synthesis of 4'-(thioacetyl)-2,2';6',2"-terpyridine (Compound Ia)

Synthesizing Operation 210 in FIG. 2

2 g of 4'-thiomethyl-2,2';6,2"-terpyridine (a compound 211 in FIG. 2, 7.14 mmol) and 0.6 g of sodium thiomethoxide (8.57 mmol) were put into a 2 neck 100 ml flask and vacuum dried for thirty minutes. 30 ml of anhydrous dimethyl formamide was put into the flask. After connecting a reflux tube to the flask while nitrogen was blown to the resultant material, the resultant material was heat stirred at 140° C. for 20 hours. After the resultant material was cooled using ice to 0□, 3 ml of acetyl chloride (42.9 mmol) was put into the flask using an injector. Next, the resultant material was stirred at a room temperature for one hour. After 200 ml of chloroform was put into the flask, the resultant material was washed three times by 200 ml of saturation brine using a separatory funnel. The organic solvent part of the resultant material was dried using magnesium sulfate constituting a drying agent. After being distilled under reduced pressure to be a saturation solution, the resultant material was refined using column chromatography (developer: chloroform) to obtain a 4'-(thioacetyl)-2, 2';6',2"-terpyridine (compound Ia) with a yield of 32%.

$^1$H NMR (300 MHz, CDCl$_3$, δ, ppm); 8.70 (d, 2H, J=4.7 Hz), 8.61 (d, 2H, J=7.9 Hz), 8.53 (s, 2H), 7.86 (dd, 2H, J=7.8, 1.7 Hz), 7.37-7.33 (m, 2H), 2.50 (s, 3H). MS: m/z (M$^+$)=307.

Figure 6:
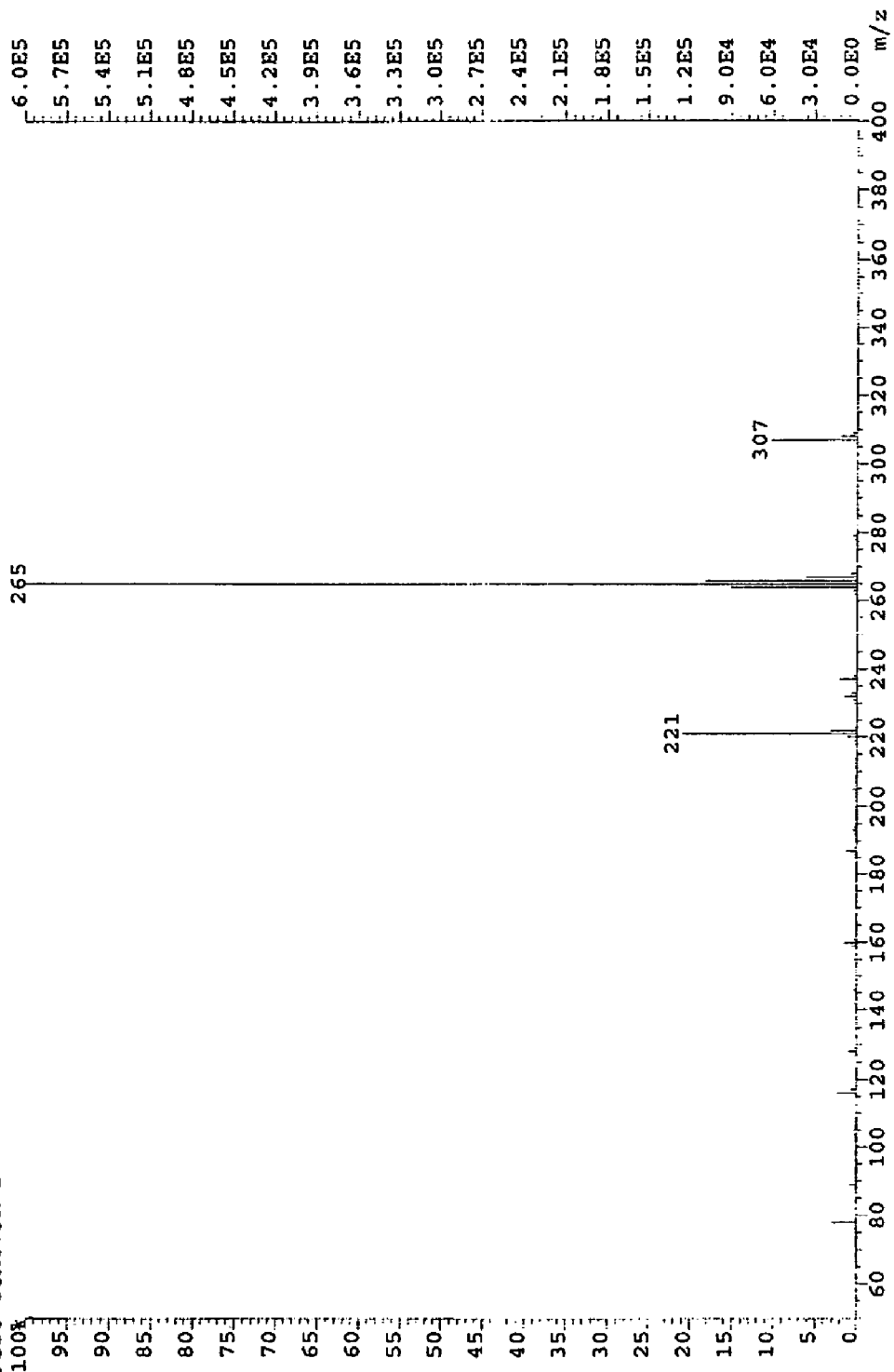
FIG. 6 is a mass spectrum of a compound Ia for a molecular electronic device synthesized using a method according to an embodiment of the present invention.

FIG. 6 is a mass spectrum of a compound Ia synthesized in Example 1.

EXAMPLE 2

Synthesis of 4'-methyl-2,2';6,2"-terpyridine (Compound 221)

Synthesizing Operation 220 in FIG. 2

0.74 g of bis triphenylphosphino nickel dichloride (1.13 mmol) was put into a 2 neck 250 ml flask and 20 ml of anhydrous tetrahydrofuran (THF) was put into the flask using an injector. 5.8 ml of methyl magnesium bromide (17.3 mmol, 3.0 M solution in ether) was added dropwise into the resultant material using an injector. The resultant material was stirred for 15 minutes at a room temperature and 2.0 g of 4'-thiomethyl-2,2';6,2"-terpyridine (compound 211 in FIG. 2, 7.14 mmol) dissolved in 40 ml of anhydrous THF was put into the flask using a cannula. After the resultant material was heat stirred for 48 hours at 40□, the resultant material was added to an ammonium chloride saturation solution (conc-NH$_4$Cl) and a predetermined material was extracted using 200 ml of chloroform (CHCl$_3$). After the extracted material was dried using Na$_2$SO$_4$ constituting a drying agent, the resultant material was distilled under reduced pressure. Next, the resultant material was refined using column chromatography (developer: THF/normal hexane=1/10) to obtain 4'-methyl-2,2';6,2"-terpyridine (compound 221) with a yield of 60%.

$^1$H NMR (400 MHz, CDCl$_3$) δ, ppm; 8.68 (m, 2H), 8.60 (d, 2H, J=7.9 Hz), 8.27 (s, 2H), 7.82 (dd, 2H, J=7.8, 1.7 Hz), 7.30-7.24 (m, 2H), 2.50 (s, 3H). MS: m/z (M$^+$)=279.

EXAMPLE 3

Synthesis of 4'-(7-bromoheptyl)-2,2';6',2"-terpyridine (Intermediate Compound 231)

Synthesizing Operation 230 in FIG. 2

0.5 ml of tetramethylpiperidine (3 mmol) and 20 ml of anhydrous THF were put into a 100 ml Schlenk flask and stirred well. After the resultant material was cooled using liquid nitrogen and ethylacetate to −78□, 1.88 mL of normal butyllithium (3 mmol, 1.6 M hexane solution) was added dropwise slowly using an injector. 15 ml of THF, in which 0.5 g of the compound synthesized in Example 2 (compound 221 in FIG. 2, 2 mmol) was dissolved, was put into the flask using an injector at −78□. After being stirred at −78□ for 30 minutes, the resultant material was added dropwise slowly into 1 ml of a 1,6-dibromohexane solution (4 mmol), in which 50 ml of THF was diluted, using a cannula at −78□. After being stirred at −78□ for 12 hours, the resultant material was distilled under reduced pressure to be a saturation solution. Next, the resultant material was refined using column chromatography (developer: THF/normal hexane=⅓) to obtain a compound 4'-(7-bromoheptyl)-2,2';6',2"-terpyridine (intermediate compound 231 in FIG. 2) with a yield of 76%.

$^1$H NMR (400 MHz, CDCl$_3$, δ, ppm): 8.69-8.67 (m, 2H), 8.61-8.58 (m, 2H), 8.27 (s, 2H), 7.82 (dd, 2H, J=11, 5.8 Hz), 7.32-7.29 (m, 2H), 3.37 (t, 2H, J=6.8 Hz), 2.77 (t, 2H, J=7.6 Hz), 1.84-1.71 (m, 4H), 1.42-1.33 (m, 6H). MS: m/z (M$^+$)=411.

Figure 7:
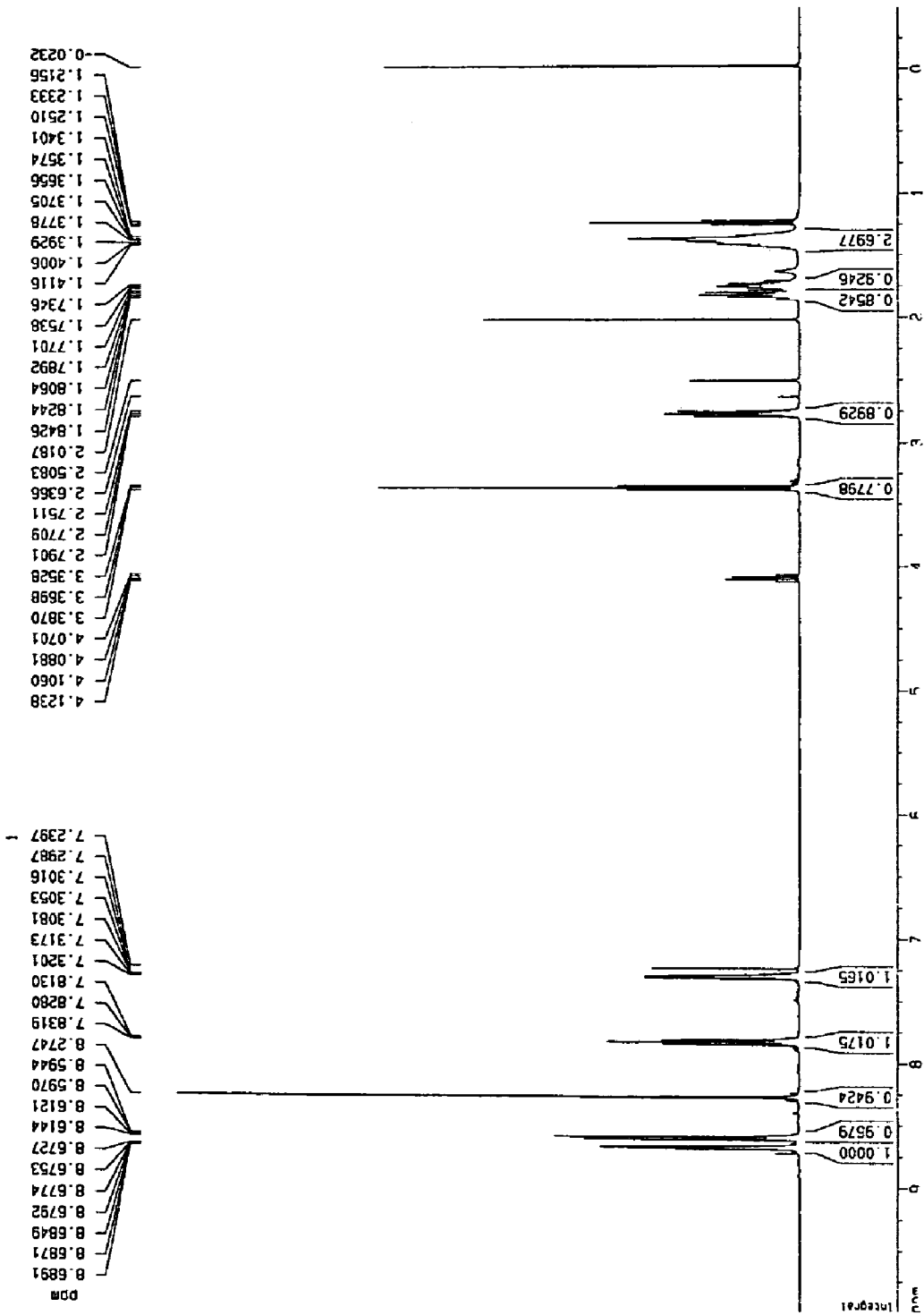
FIG. 7 is a $^1$H-nuclear magnetic resonance spectrum of an intermediate compound 231 for a molecular electronic device synthesized using a method according to an embodiment of the present invention.

FIG. 7 is a $^1$H-nuclear magnetic resonance spectrum of the intermediate compound 231 synthesized in Example 3.

EXAMPLE 4

Synthesis of 4'-(13-bromo tridecyl)-2,2';6',2"-terpyridine (Intermediate Compound 241)

Synthesizinq Operation 240 in FIG. 2

An objective material was synthesized using the same method as in Example 3 except that the resultant material was added dropwise slowly into a 1,12-dibromododecane 2.52 g (7.68 mmol) solution instead of 1,6-dibromohexane using a cannula at −78□ and stirred at −78□ for 28 hours.

A product obtained from a hydrogen nuclear magnetic resonance spectrum and a mass spectrum was 4'-(13-bromo tridecyl)-2,2';6',2"-terpyridine (intermediate compound 241 in FIG. 2).

$^1$H NMR (400 MHz, CDCl$_3$, δ, ppm): 8.69-8.66 (m, 2H), 8.61-8.59 (m, 2H), 8.26 (s, 2H), 7.85-7.80 (m, 2H), 7.32-7.28 (m, 2H), 3.36 (t, 2H, J=6.8 Hz), 2.73 (t, 2H, J=7.6 Hz), 1.84-1.68 (m, 4H), 1.42-1.33 (m, 18H). MS: m/z (M$^+$)=496.

Figure 8:
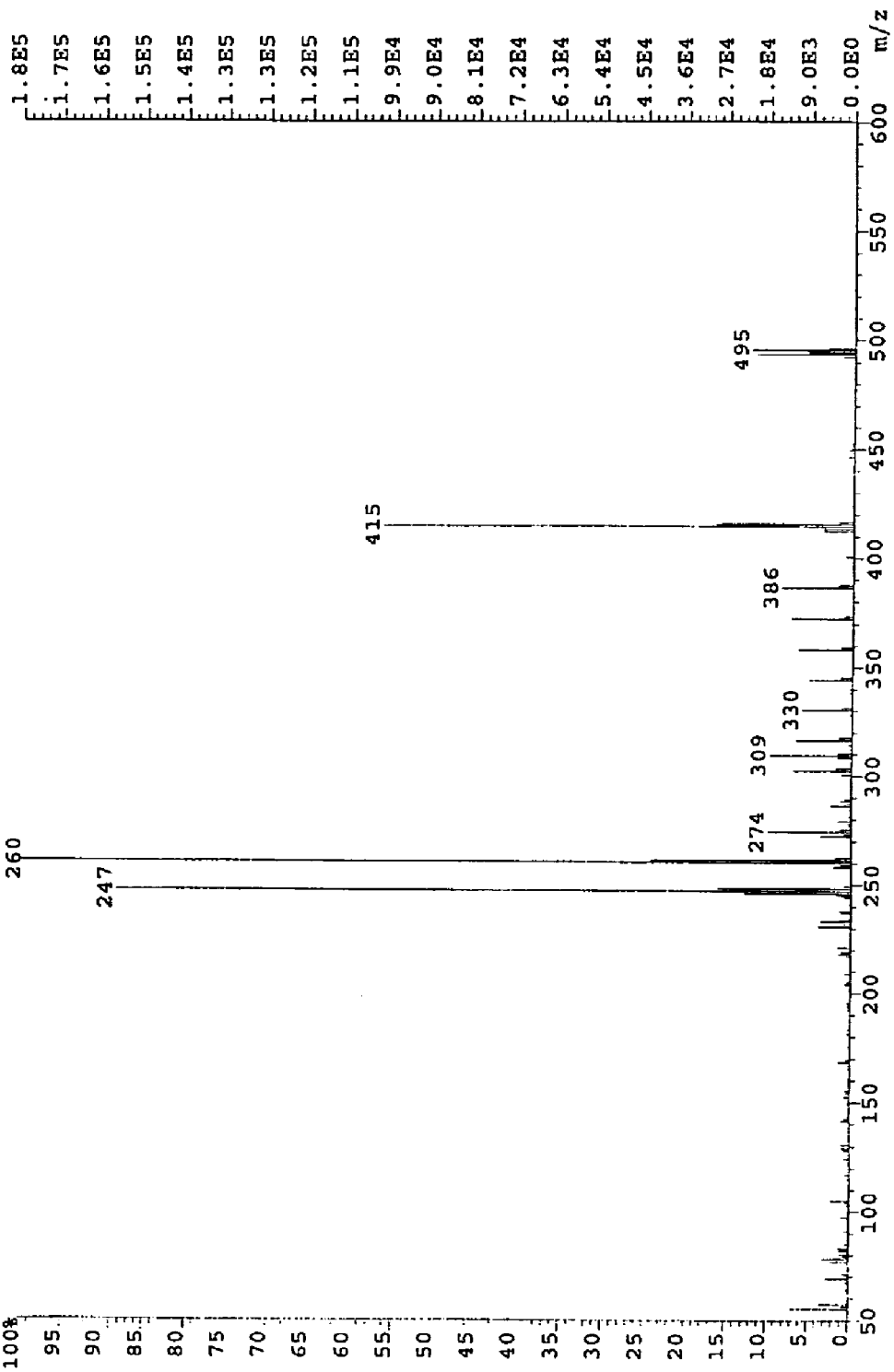
FIG. 8 is a mass spectrum of an intermediate compound 241 for a molecular electronic device synthesized using a method according to an embodiment of the present invention.

FIG. 8 is a mass spectrum of the intermediate compound 241 obtained in Example 4.

EXAMPLE 5

Synthesis of 4'-(7-thioacetylheltyl)-2,2';6',2"-terpyridine (Compound Ib)

Synthesizinq Operation 250 in FIG. 2

1.0 g of the intermediate compound 231 (4'-(7-bromoheptyl)-2,2';6',2"-terpyridine, 2.44 mmol) obtained in Example 3 and 0.42 g of potassiumthioacetate (3.66 mmol) were put into a 100 ml flask and vacuum dried for thirty minutes. Next, 5 ml of DMF (N,N-Dimethylformamide) was applied to the resultant material. The resultant material was reacted at a room temperature for one hour and thirty minutes. 200 ml of distilled water was applied to the resultant material to complete reactions. 200 ml of methylene chloride was applied to the resultant material. Next, a solution, which was extracted from the resultant material using a separatory funnel, was distilled under reduced pressure and refined using column chromatography (developer: THF) to obtain a compound 4'-(7-thioacetylheptyl)-2,2';6',2"-terpyridine (compound Ib in FIG. 2) with a yield of 65%.

$^1$H NMR (400 MHz, CDCl$_3$, δ, ppm): 8.67-8.65 (m, 2H), 8.60-8.57 (m, 2H), 8.26 (s, 2H), 7.81 (dd, 2H, J=10.5, 5.6 Hz), 7.30-7.26 (m, 2H), 2.82 (t, 2H, J=7.3 Hz), 2.75 (t, 2H, J=7.8 Hz), 2.27 (s, 3H), 1.74-1.68 (m, 2H), 1.54-1.48 (m, 2H), 1.39-1.32 (m, 6H). MS: m/z (M$^+$)=405.

Figure 9:
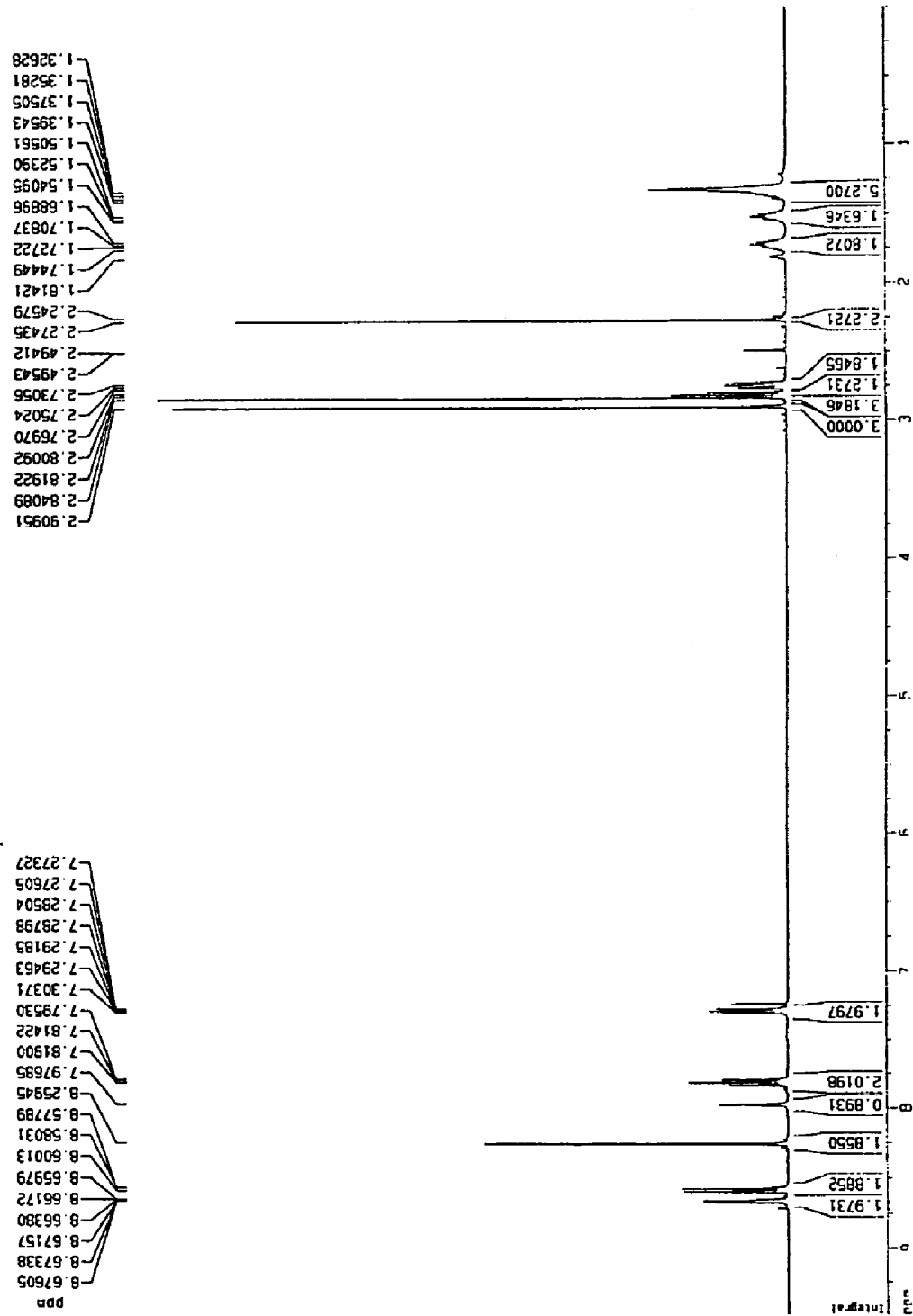
FIG. 9 is a $^1$H-nuclear magnetic resonance spectrum of a compound Ib for a molecular electronic device synthesized using a method according to an embodiment of the present invention.

FIG. 9 is a $^1$H-nuclear magnetic resonance spectrum of the compound Ib synthesized in Example 5.

EXAMPLE 6

Synthesis of 4'-(13-thioacetyltridecyl)-2,2',6',2"-terpyridine (compound Ic)

Synthesizing Operation 260 in FIG. 2

An objective material was synthesized using the same method as in Example 5 except that 1.54 g of 4'-(13-bromotridecyl)-2,2';6',2"-terpyridine (intermediate compound 241, 3.11 mmol) instead of 4'-(7-bromoheptyl)-2,2';6',2"-terpyridine (intermediate compound 231) was used, and the resultant material was stirred at a room temperature for one hour after DMF was applied to the resultant material.

A product obtained from a hydrogen nuclear magnetic resonance spectrum and mass spectrum was 4'-(13-thioacetyltridecyl)-2,2';6',2"-terpyridine (compound Ic).

$^1$H NMR (400 MHz, CDCl$_3$, δ, ppm): 8.72-8.67 (m, 2H), 8.63-8.59 (m, 2H), 8.26 (s, 2H), 7.85-7.80 (m, 2H), 7.32-7.28 (m, 2H), 2.85-2.67 (m, 4H), 2.29 (s, 3H), 1.77-1.72 (m, 2H), 1.59-1.47 (m, 2H), 1.40-1.15 (m, 18H). MS: m/z (M$^+$)=489.

Figure 10:
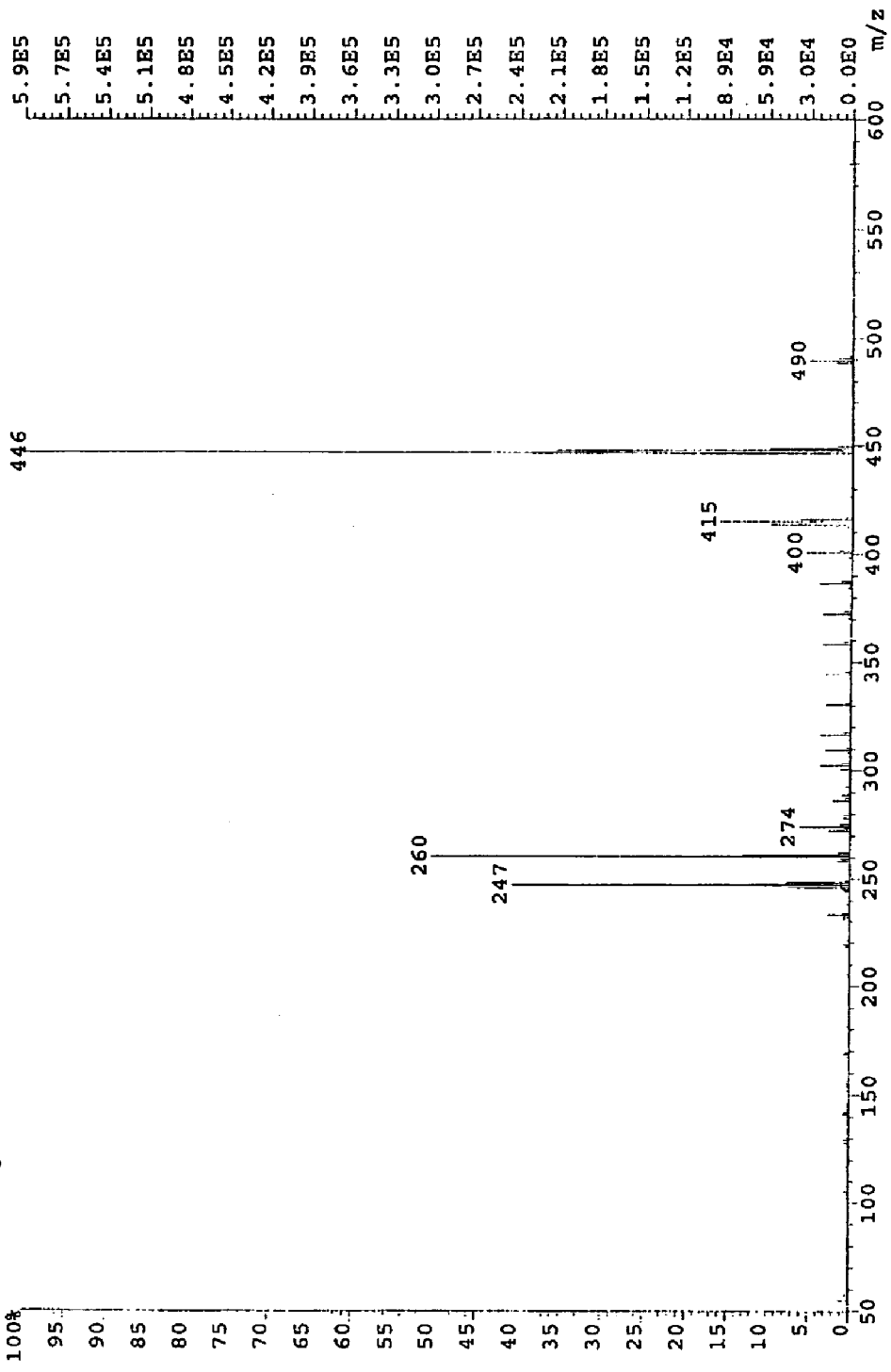
FIG. 10 is a mass spectrum of a compound Ic for a molecular electronic device synthesized using a method according to an embodiment of the present invention.

FIG. 10 is a mass spectrum of the compound Ic obtained in Example 6.

EXAMPLE 7

Synthesis of Compound IIb

Synthesizing Operation 270-1 in FIG. 2

40 ml of ethanol/distilled water (3/1) was put into 0.16 g of the compound 4'-(thioacetyl)-2,2';6',2"-terpyridine (compound Ia, 0.52 mmol) in Example 1 and rutheniumtrichloride hydrate 0.05 g (0.24 mmol) and heat stirred at 120° C. for four hours. After the resultant material was cooled to a room temperature, 3 ml of distilled water, in which 3.64 g of ammonium hexafluorophosphate (22.36 mmol) was dissolved, was put into the resultant material. After stirring at a room temperature for ten minutes, the resultant material was separated using a sintering funnel. The separated materials were washed with distilled water and ethanol several times in that order and washed using ether several times. Undissolved solids were dried to obtain the compound IIb with a yield of 78%.

MS: m/z (M$^+$)=976.

EXAMPLE 8

Synthesis of Compound IId

Synthesizing Operation 270-2 in FIG. 2

An objective material was synthesized using the same method as in Example 7 except that 0.2 g of 4'-(7-thioacetylheptyl)-2,2';6',2"-terpyridine (compound Ib, 0.49 mmol) instead of 4'-(thioacetyl)-2,2';6',2"-terpyridine (compound Ia) was used, and the resultant material was heat stirred for three hours.

A product obtained from a hydrogen nuclear magnetic resonance spectrum and mass spectrum was a compound IId in FIG. 2.

MS: m/z (M$^+$)=1114.

EXAMPLE 9

Synthesis of Compound IIf

Synthesizing Operation 270-3 in FIG. 2

An objective material was synthesized using the same method as in Example 7 except that 0.2 g of 4'-(13-thioacetyltridecyl)-2,2';6',2"-terpyridine (compound Ic, 0.41 mmol) instead of 4'-(thioacetyl)-2,2';6',2"-terpyridine (compound Ia) was used, and the resultant material was heat stirred for three and a half hours. A product obtained from hydrogen nuclear magnetic resonance spectrum and mass spectrum was a compound IIf in FIG. 2.

MS: m/z (M$^+$)=1370.

Figure 11:
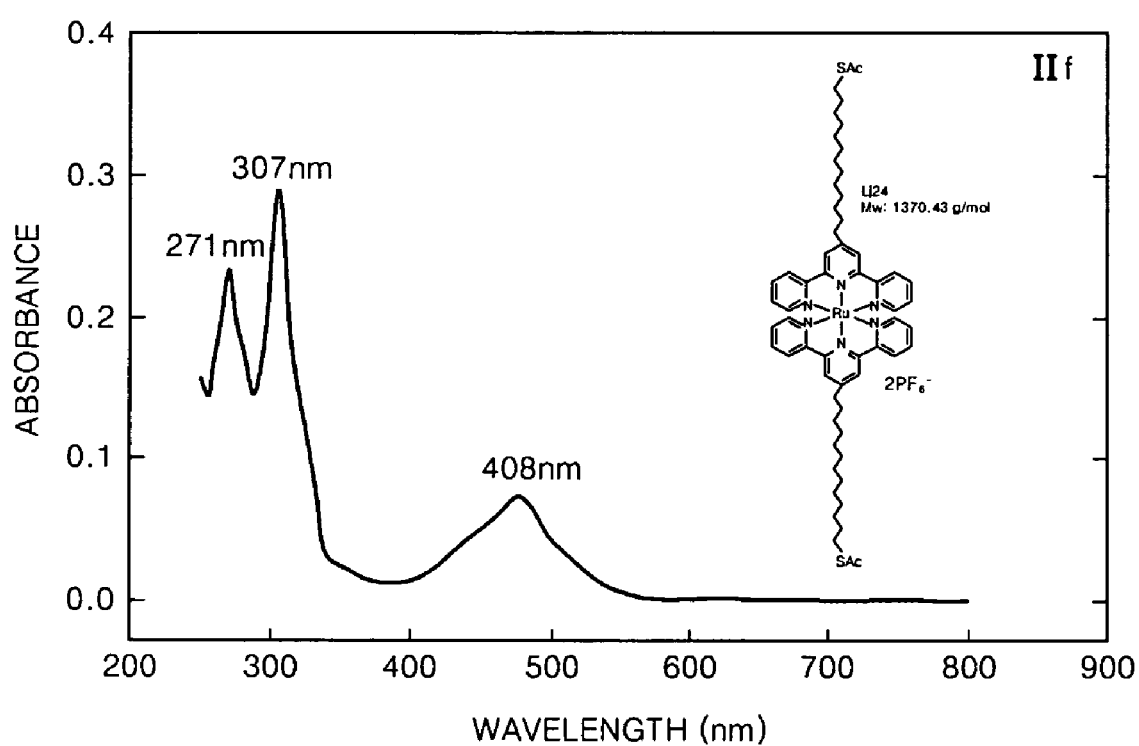
FIG. 11 is an ultraviolet rays/visible rays (UV/VIS) spectrum of a compound IIf for a molecular electronic device synthesized using a method according to an embodiment of the present invention.

FIG. 11 is an ultraviolet rays/visible (UV/VIS) rays spectrum of the compound IIf synthesized in Example 9.

EXAMPLE 10

Synthesis of Compound IIa

Synthesizing Operation 290-1 in FIG. 2

40 ml of ethanol/distilled water (3/1) was applied to 0.2 g of terpyridinerutheniumtrichloride (compound 281, 0.45 mmol) and 0.14 g of 4'-(thioacetyl)-2,2';6',2"-terpyridine (compound Ia, 0.45 mmol) synthesized in Example 1 and heat stirred for five hours. After the resultant material was cooled to a room temperature, 2 ml of distilled water, in which 2.93 g of ammonium hexafluorophosphate (18 mmol) was dissolved, was applied to the resultant material. After stirring at a room temperature for ten minutes, the resultant material was separated using a sintering funnel. The separated materials were washed with distilled water and ethanol several times in that order and washed using ether several times. Undissolved solids were dried to obtain a compound IIa with a yield of 65%.

MS: m/z (M$^+$)=1006.

Figure 12:
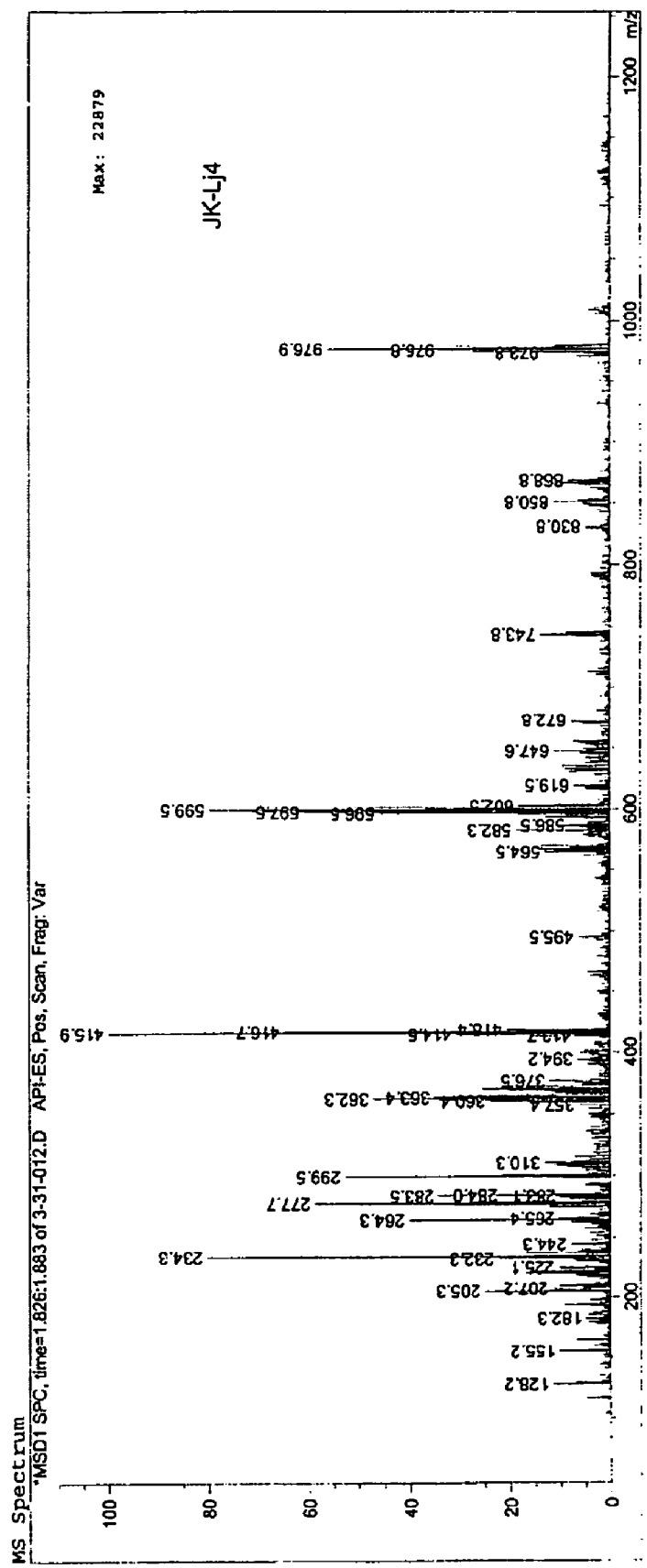
FIG. 12 is a mass spectrum of a compound IIa for a molecular electronic device synthesized using a method according to an embodiment of the present invention.

FIG. 12 is a mass spectrum of the compound IIa obtained in Example 10.

EXAMPLE 11

Synthesis of Compound IIc

Synthesizing Operation 290-2 in FIG. 2

An objective material was synthesized using the same method as in Example 10 except that 0.22 g of 4'-(7-thioacetylheptyl)-2,2';6',2"-terpyridine (compound Ib, 0.53 mmol) instead of 4'-(thioacetyl)-2,2';6',2"-terpyridine (compound Ia) was used, and the resultant material was heat stirred for 6 hours.

A product obtained from a hydrogen nuclear magnetic resonance spectrum and mass spectrum was a compound IIc in FIG. 2.

$^1$H NMR (400 MHz, (CD$_3$)$_2$CO δ, ppm): 9.07-8.94 (m, 4H), 8.80-8.75 (m, 4H), 8.55 (t, 1H, J=8.1 Hz), 8.07-8.02 (m, 4H), 7.68-7.63 (m, 4H), 7.33-7.27 (m, 4H), 3.27 (t, 2H, J=7.8 Hz), 2.87 (t, 2H, J=7.3 Hz), 2.26 (s, 3H), 1.62-1.53 (m, 4H), 1.53-1.46 (m, 6H). MS: m/z (M$^+$)=1030.

Figure 13:
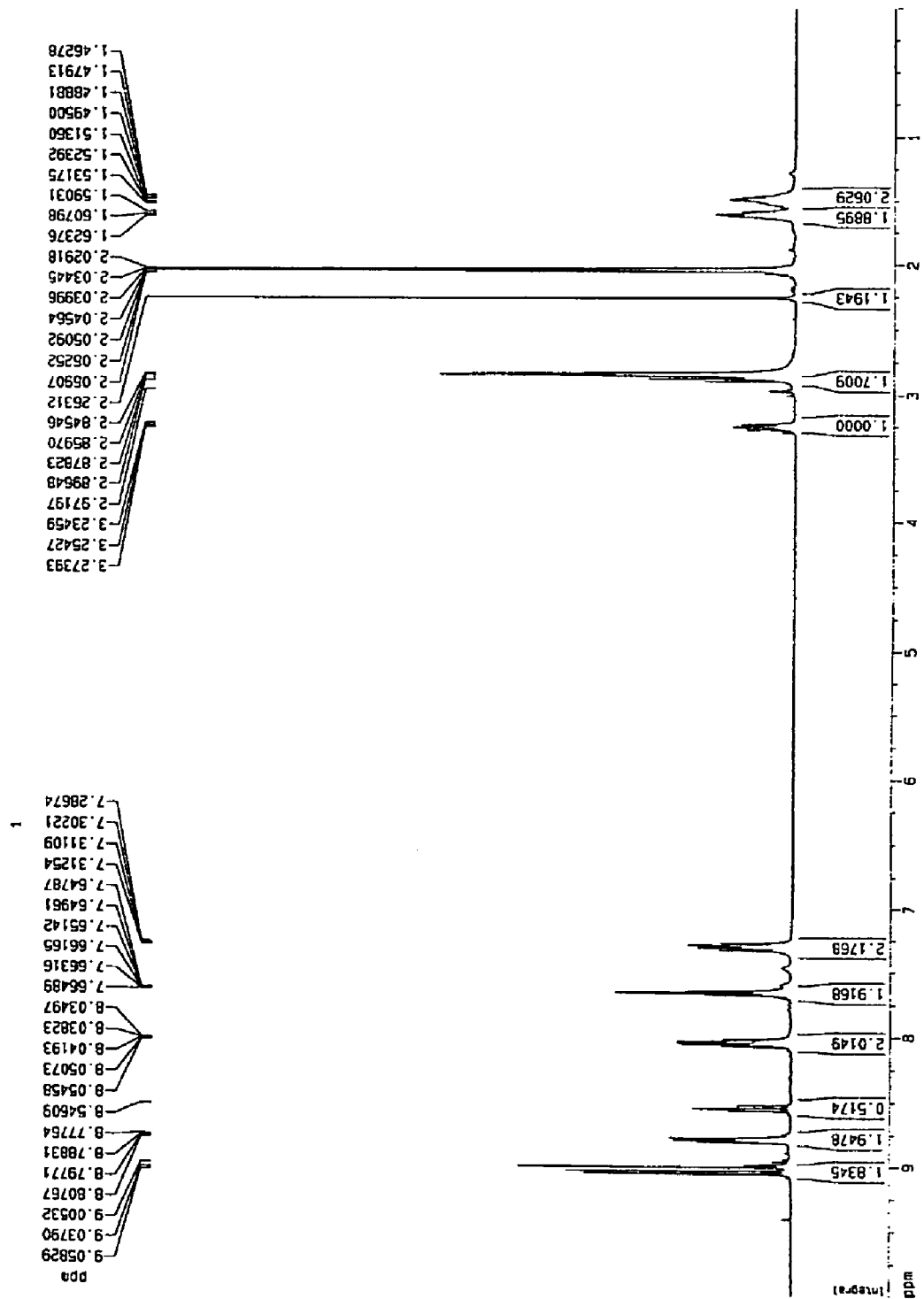
FIG. 13 is a $^1$H-nuclear magnetic resonance spectrum of a compound IIc for a molecular electronic device synthesized using a method according to an embodiment of the present invention.

FIG. 13 is a $^1$H-nuclear magnetic resonance spectrum of the compound IIc obtained in Example 11.

Figure 14:
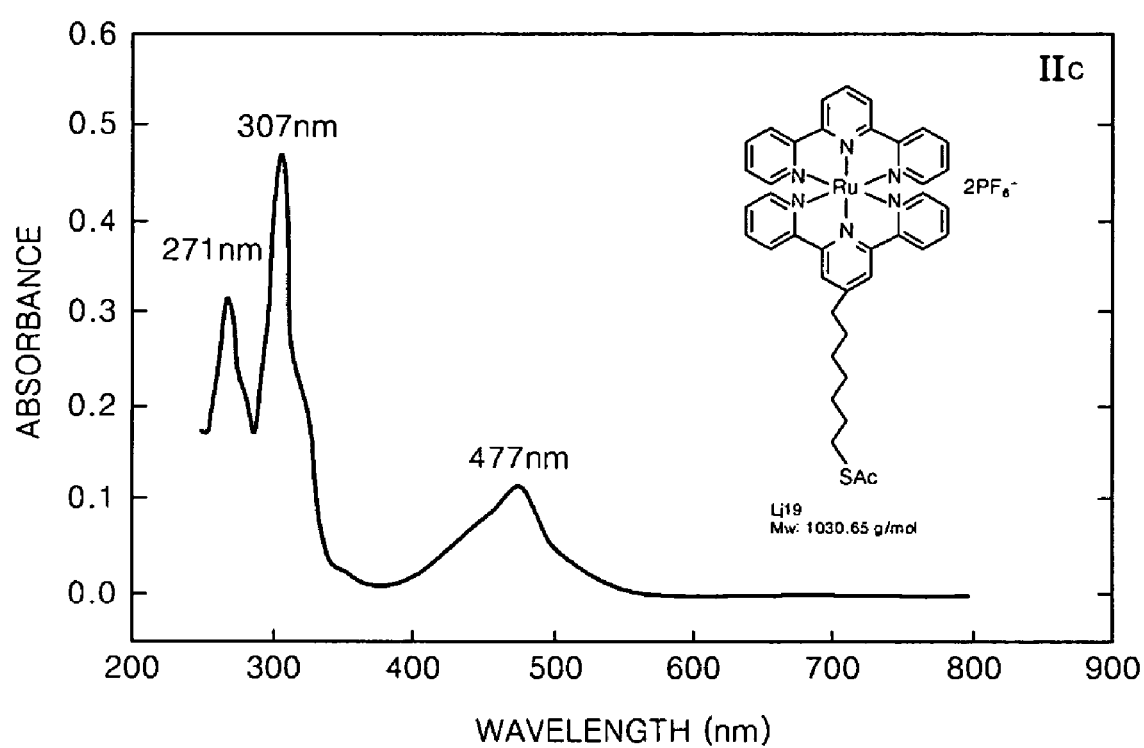
FIG. 14 is a UV/VIS spectrum of a compound IIc for a molecular electronic device synthesized using a method according to an embodiment of the present invention.

FIG. 14 is a UV/VIS spectrum of the compound IIc obtained in Example 11.

EXAMPLE 12

Synthesis of Compound IIe

Synthesizing Operation 290-3 in FIG. 2

An objective material was synthesized using the same method as in Example 10 except that 0.15 g of 4'-(13-thioacetyltridecyl)-2,2';6',2"-terpyridine (compound Ic, 0.31 mmol) instead of 4'-(thioacetyl)-2,2';6',2"-terpyridine (compound Ia) was used, and the resultant material was heat stirred for 6 hours.

A product obtained from a hydrogen nuclear magnetic resonance spectrum and mass spectrum was a compound IIe in FIG. 2.

$^1$H NMR (400 MHz, (CD$_3$)$_2$CO δ, ppm): 9.04-8.98 (m, 4H), 8.79-8.76 (m, 4H), 8.53 (t, 1H, J=8.0 Hz), 8.06-8.01 (m, 4H), 7.67-7.59 (m, 4H), 7.37-7.26 (m, 4H), 3.22 (t, 2H, J=7.6 Hz), 2.83 (t, 2H, J=7.1 Hz), 2.28 (s, 3H), 1.61-1.20 (m, 22H). MS: m/z (M$^+$)=1200.

Figure 15:
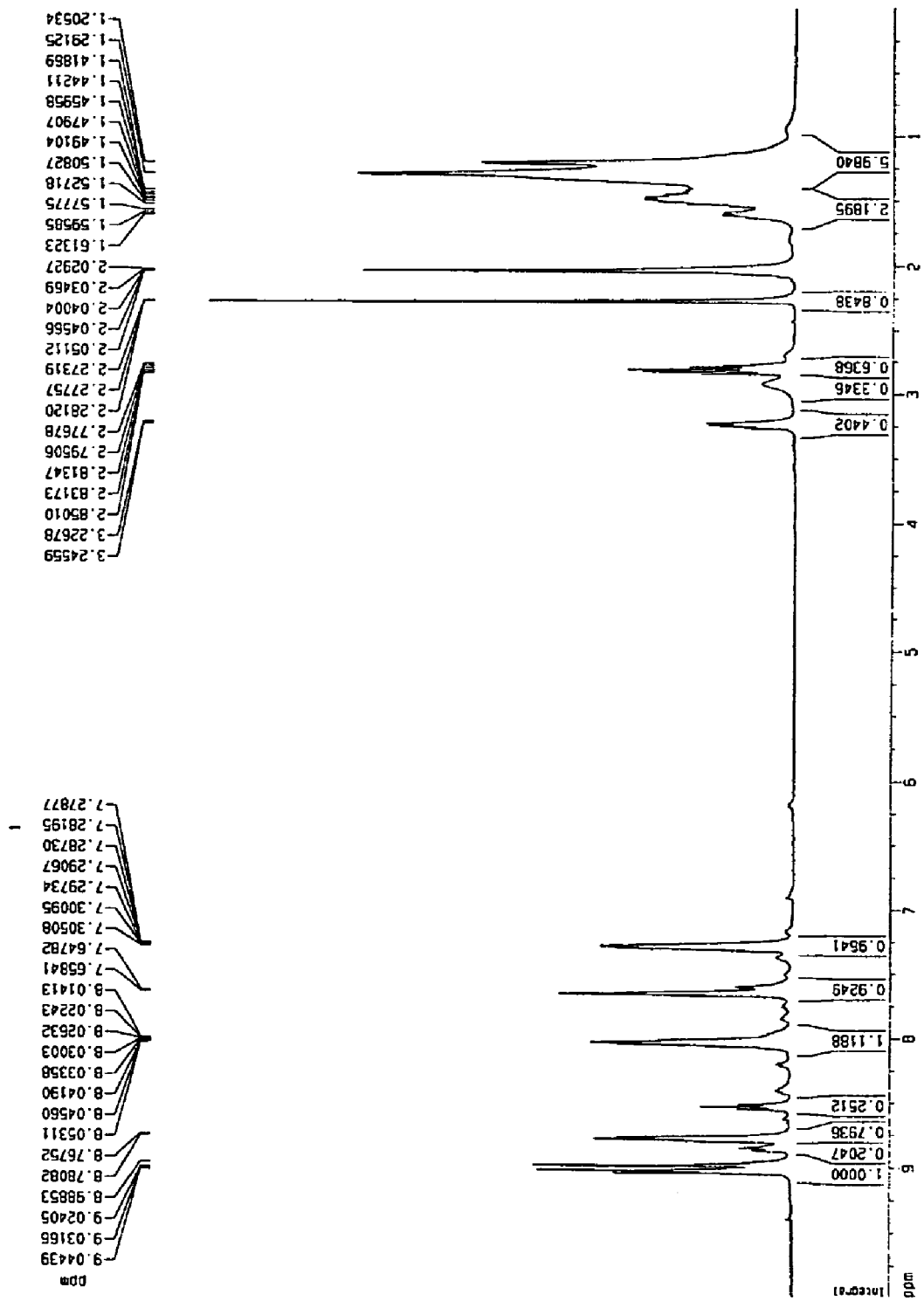
FIG. 15 is a $^1$H-nuclear magnetic resonance spectrum of a compound IIe for a molecular electronic device synthesized using a method according to an embodiment of the present invention.

FIG. 15 is a $^1$H-nuclear magnetic resonance spectrum of the compound IIe obtained in Example 12.

Figure 16:
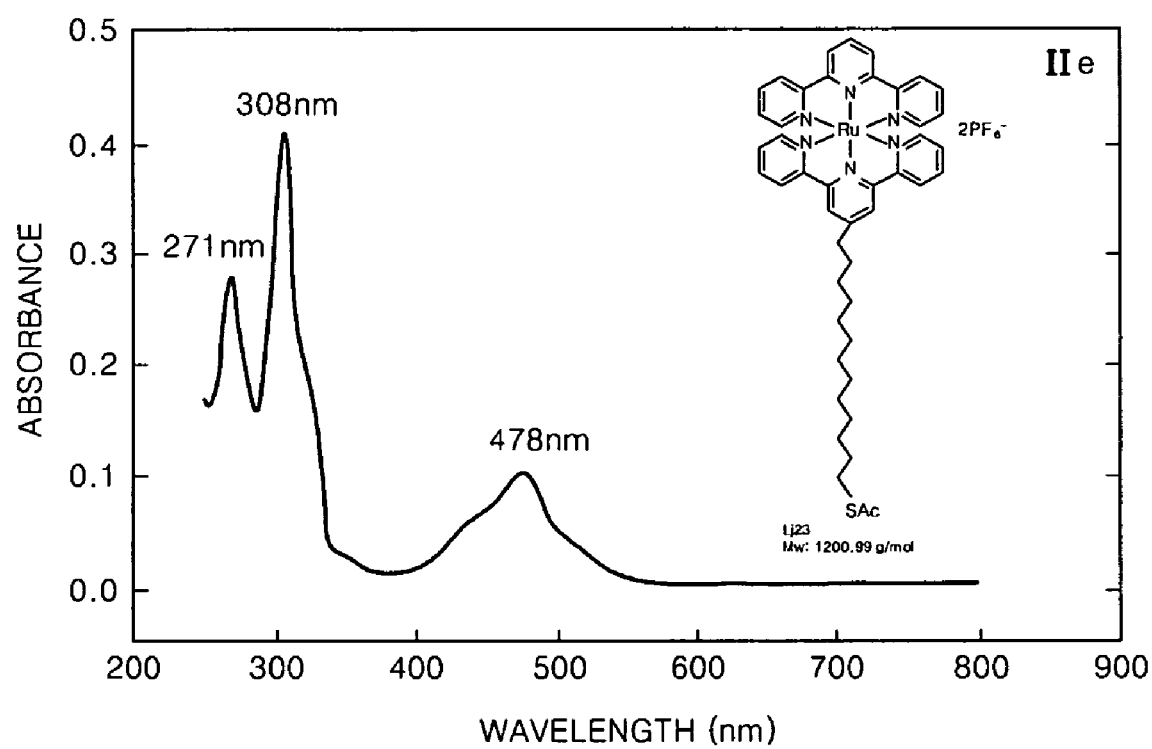
FIG. 16 is a UV/VIS spectrum of a compound IIe for a molecular electronic device synthesized using a method according to an embodiment of the present invention.

FIG. 16 is a UV/VIS rays spectrum of the compound IIe obtained in FIG. 12.

EXAMPLE 13

Evaluation of Oxidation—Reduction Properties

To evaluate the oxidation—reduction properties of the organic metal compound according to an embodiment of the present invention, a cyclic voltammetry experiment was performed with respect to a compound IIc synthesized in Example 11 and a compound IIe synthesized in Example 12.

Figure 17:
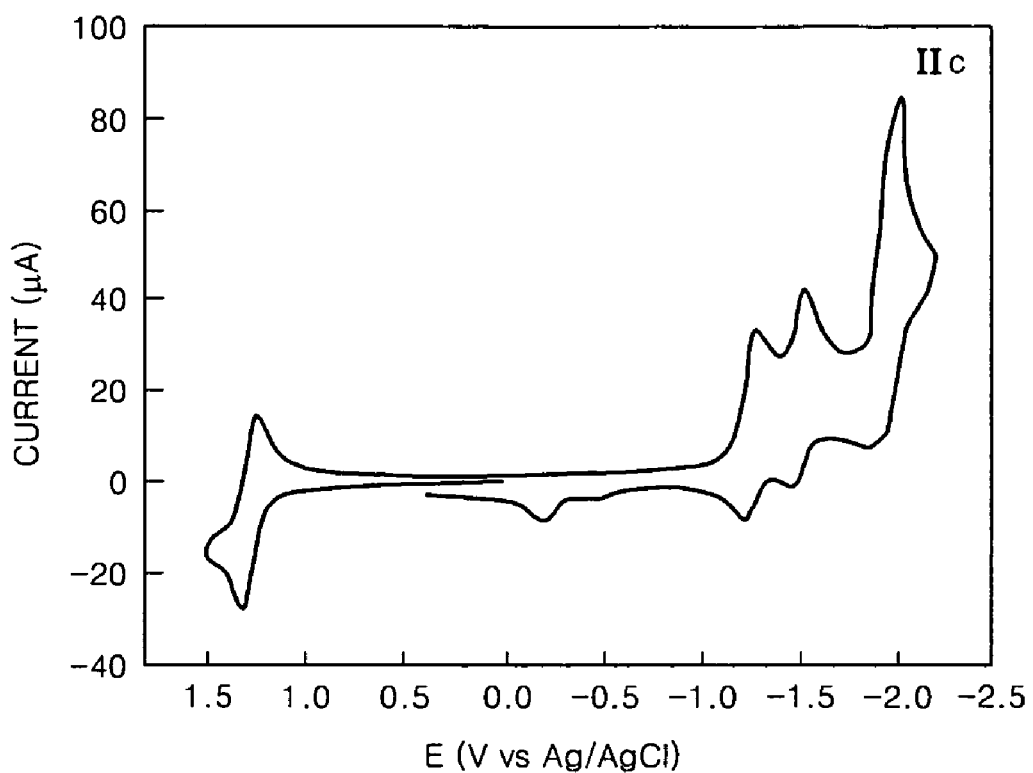
FIG. 17 is a cyclic voltammogram obtained for a compound IIc using a method according to an embodiment of the present invention.
Figure 18:
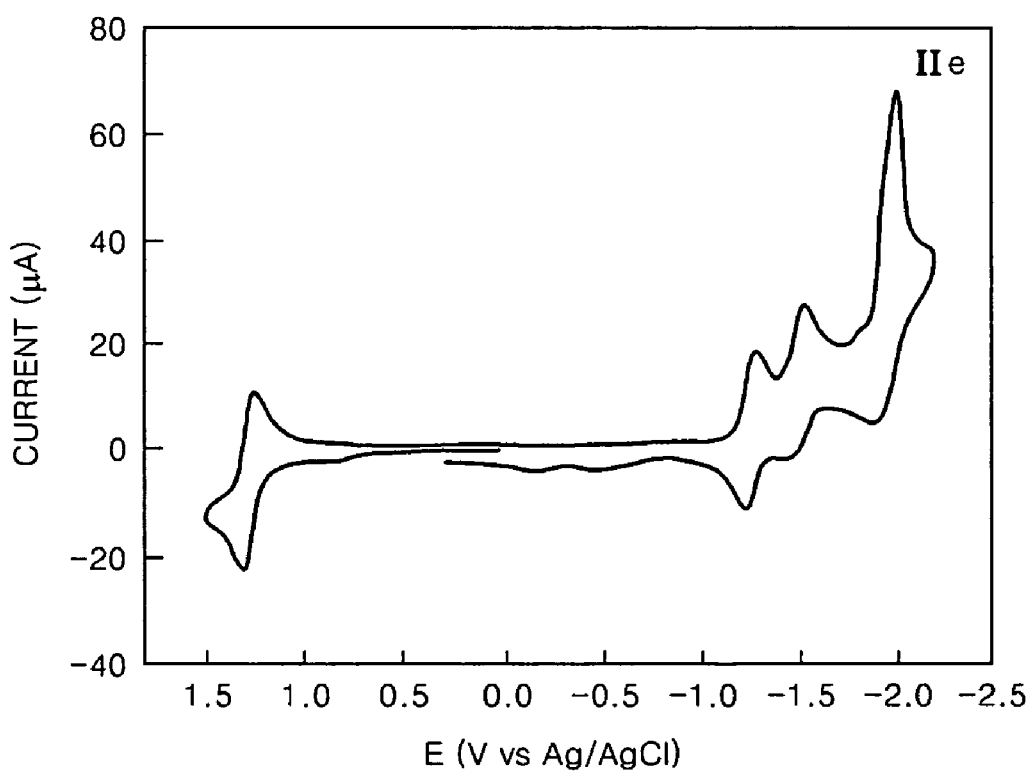
FIG. 18 is a cyclic voltammogram obtained for a compound IIe using a method according to an embodiment of the present invention.

FIGS. 17 and 18 are cyclic voltammograms obtained with respect to the compound IIc and the compound IIe respectively.

Results of FIGS. 17 and 18 were obtained using a scanning rate of 0.1 V/s from 0V in the positive electric potential direction. From the results of FIGS. 17 and 18, reversible Ru(II)/Ru(III) oxidation and reduction peaks were noticed near 1.2 V. In addition, an reduction peak of a ligand (terpyridine) part could be noticed reversibly near −1.2 V, −1.5 V, and −1.9 V. From the results of FIGS. 17 and 18, it was noticeable that the compound IIc and the compound IIe were each oxidation-reduction activated and that the compound IIc and the compound IIe could be each applied to materials of molecular memory devices based on these results.

EXAMPLE 14

Manufacture of Molecular Electronic Device

To immobilize the compounds (compounds IIa, IIb, IIc, IId, IIe and IIf in FIG. 2) obtained in Examples 7 through 12 onto an electrode of a molecular electronic device, self-assembling methods were used. First, a gold electrode was used as a lower electrode. A lower electrode having patterns of three lines was formed using a known compound semiconductor process as shown in FIG. 3. To form the lower electrode, a nano imprint process was used. Generally, an appropriate line width of the lower electrode was 5-50 μm. In Example 14, a lower electrode having a line width of 5 μm and a thickness of 50 μm was formed.

The compounds IIa, IIb, IIc, IId, IIe and IIf were each dissolved in organic solvents. The compounds IIc, IId, IIe and IIf, which had relatively long alkyl chains, were well dissolved in general organic solvents. The compounds IIa and IIb, in which alkyl groups were not included, were dissolved in polar solvents such as DMF, dimethylsulfoxide (DMSO), etc.

10 ml of solutions, in which each of the compounds was dissolved in DMF solution with a 1 mmol concentration, were prepared in Example 14. Here, anoxic and anhydrous DMF solvents were used in a glove box in which anoxic and anhydrous conditions were maintained.

As described above, the resultant material, which was formed on the lower electrode, was each dipped into the prepared solutions. A molecular layer obtained each from the compounds IIa, IIb, IIc, IId, IIe and IIf was fixed onto the surface of the lower electrode using self-assembling methods. After the dipping operation was continued for 24 hours, respective resultant materials including a molecular layer, which was formed on the lower electrode, were washed with DMF, THF, ethanol and distilled water in that order. The washed resultant materials were put into a low temperature vacuum oven (40☐, $10^{-3}$ Torr) and were dried for more than 2 hours. An upper electrode formed of gold was formed on the molecular layer using evaporation equipment maintained to a vacuum of $10^{-6}$ Torr and a low temperature of −78☐.

EXAMPLE 15

Analysis of Electrode Surface on which an Organic Metal Compound was Self-Assembled With respect to the molecular electronic device manufactured in Example 14, the surface of the lower electrode, on which the compounds IIa, IIb, IIc, IId, IIe and IIf in FIG. 2 were each self-assembled, was analyzed using ellipsometry.

Figure 19:
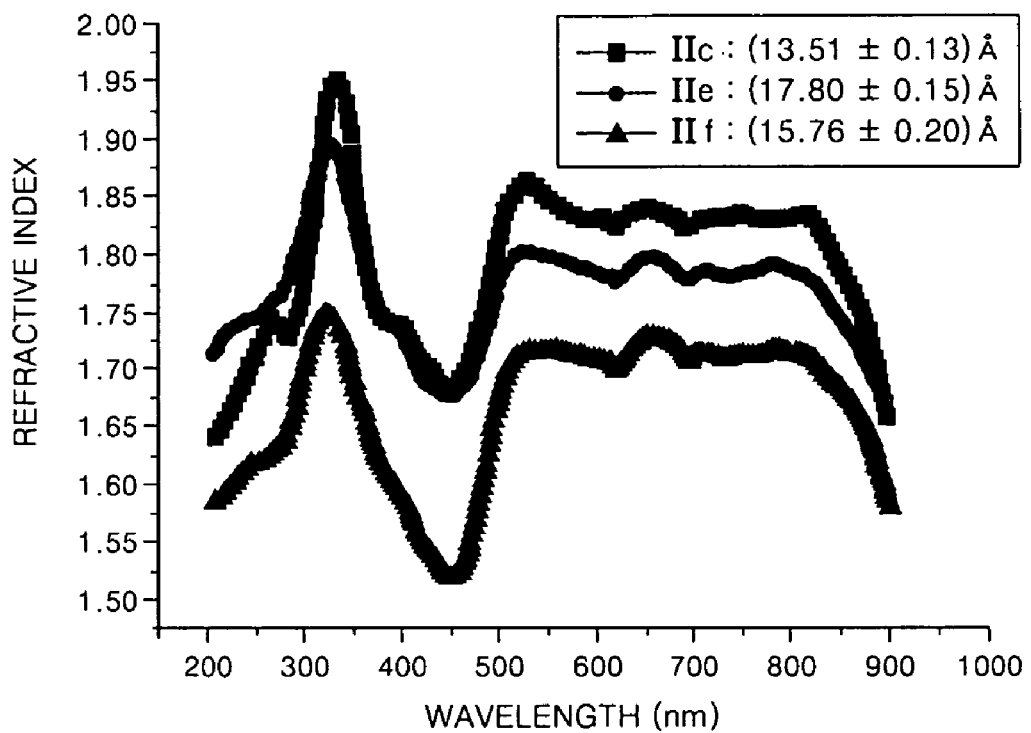
FIGS. 19 and 20 are graphs illustrating results of surface analysis for lower electrodes, on which compounds IIc, IIe and IIf synthesized using a method according to an embodiment of the present invention are each self-assembled, using ellipsometry.
Figure 20:
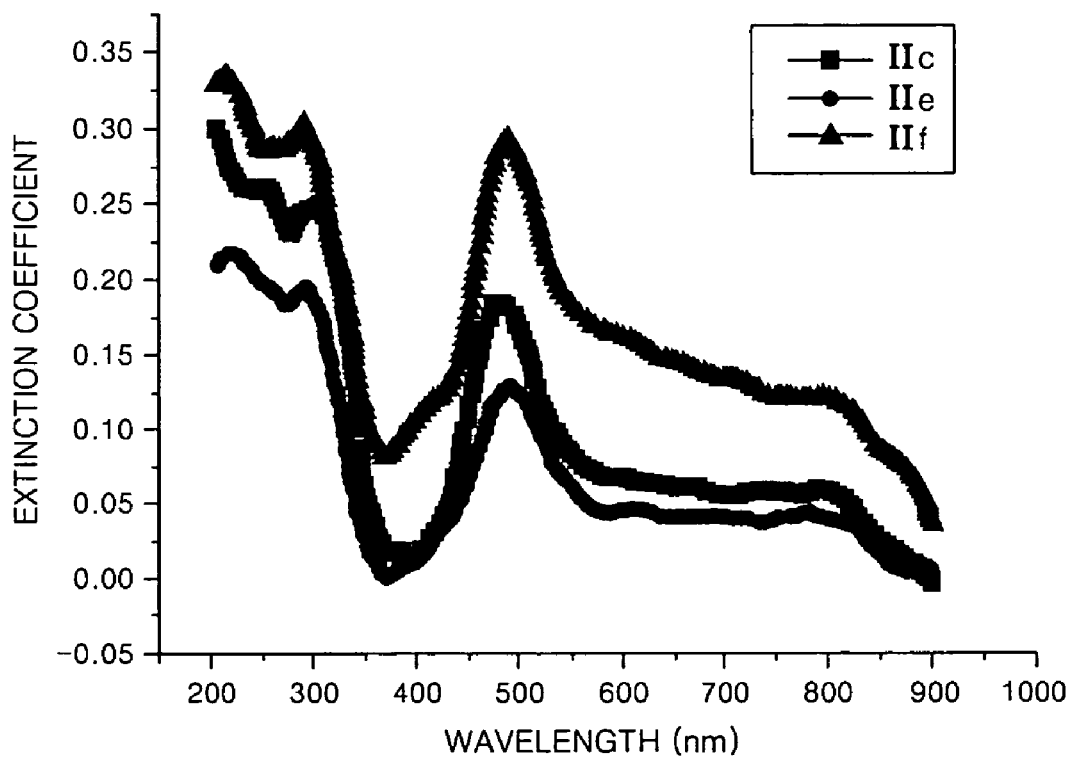

FIGS. 19 and 20 are graphs illustrating results of surface analysis of the lower electrode, on which compounds IIc, IIe and IIf were self-assembled, using ellipsometry respectively.

In FIG. 19, the thicknesses of single molecular layers measured from these analysis results are illustrated. The single molecular layers include the self-assembled compounds IIc, IIe and IIf, respectively. The thicknesses of the single molecular layers were each about 13-18☐.

When analysis results of an extinction coefficient according to wavelengths in FIG. 20 were each compared with UV/VIS spectrums illustrated in FIGS. 11, 14 and 16, peaks of absorption spectrums were observed at very similar regions (vicinity of 480 nm). From these results, it could be seen that a compound was bonded onto a gold electrode using self-assembling methods to form a single molecular layer.

EXAMPLE 16

Measurement of Switching Characteristics and Memory Characteristics of Molecular Electronic Device To measure switching characteristics and memory characteristics of the molecular electronic device manufactured in Example 14, the following experiment was performed. First, to inhibit degradation such as an oxidation of molecules, etc. in the molecular electronic device manufactured in Example 14, the molecular electronic device was kept in a vacuum chamber, in which a room temperature was maintained, and the switching characteristics and memory characteristics of the molecular electronic device were measured. Current-voltage properties were measured using a semiconductor parameter analyzer (HP 4156C, measurable from 1fA/2V to 1A/200V). The molecular hysteresis properties of the molecular electronic device were measured from an analysis of measurement results in two directions. That is, switching characteristics and memory characteristics could be obtained from measurement results in each from + voltage to − voltage, and − voltage to + voltage. In addition, switching characteristics were obtained from measurement of 0→+ voltage→− voltage→+ voltage in voltage loop.

Figure 21:
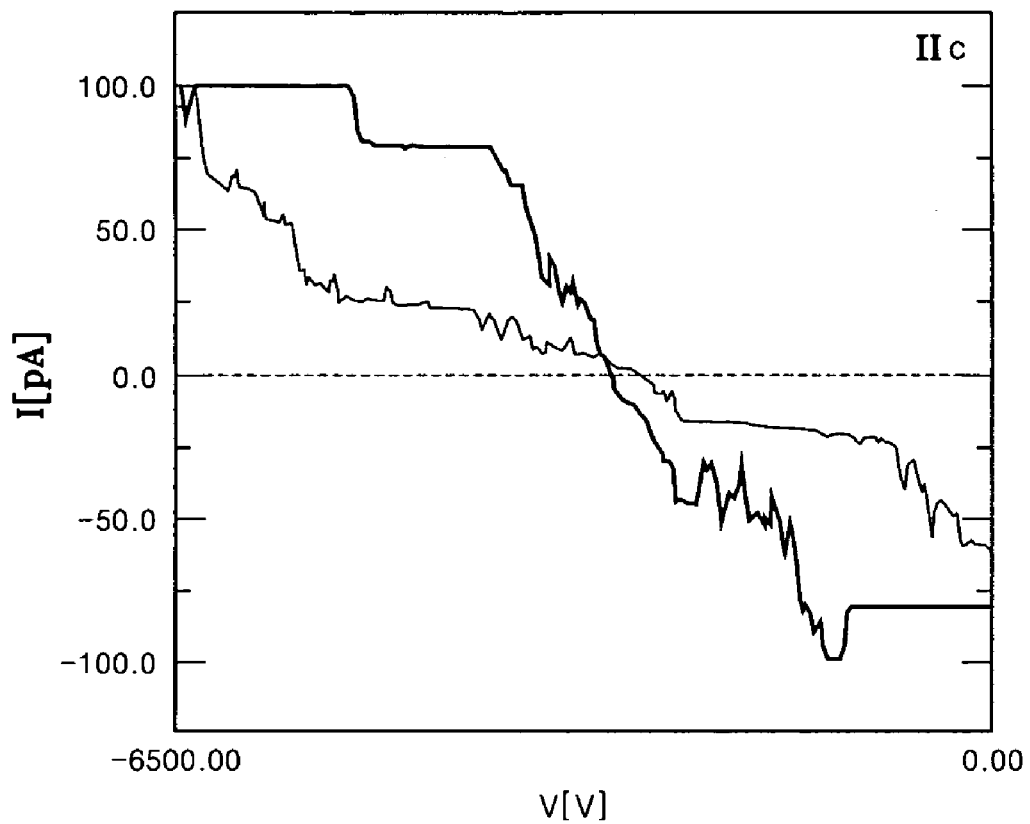
FIG. 21 is a hysteresis graph illustrating switching characteristics for a molecular electronic device according to an embodiment of the present invention.

FIG. 21 is a graph illustrating switching characteristics of the molecular electronic device manufactured using the compound IIc.

Measurements of pulses for realizing memory characteristics were performed using a pulse generator unit (HP 41501 expander) and a measurements/pulses selector unit (SMU-PGU selector, HP 16440A) which were connectable with the above measurement device.

Figure 22:
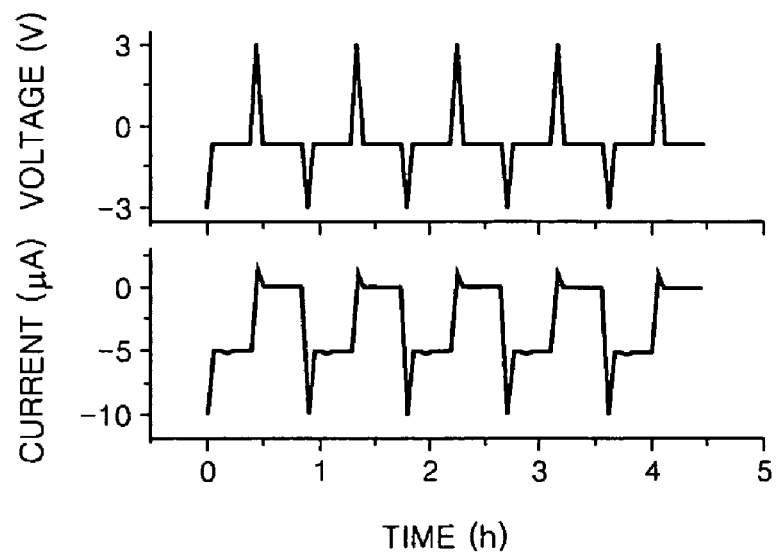
FIG. 22 is a graph illustrating measurement results in which memory characteristics for a molecular electronic device according to an embodiment of the present invention are shown.

FIG. 22 is a graph illustrating measurement results of memory characteristics of the molecular electronic device manufactured using the compound IIc. In particular, the pulse generator unit should be established so as to have a measurement range from several Hz to several MHz considering the measurement range of the switching characteristics of the molecular memory device. In addition, the pulse generator unit should ensure that rising/falling times of voltage pulses are less than 100 ns.

The organic metal compound according to an embodiment of the present invention includes a terpyridine-ruthenium compound including a thiol group. A molecular active layer, which is formed to be a single molecular layer on a metal electrode using self-assembling methods, may be formed from compounds according to an embodiment of the present invention. By forming the self-assembled molecular active layer including the compound according to an embodiment of the present invention between the upper and lower electrodes using the above methods, a molecular electronic device having switching characteristics and memory characteristics can be implemented. A self-assembled film can be formed to be a single molecular layer having a micro film in the order of several nm. In addition, by adjusting a length of alkyl chain included in the compounds in the synthesizing operation of the compounds according to the present invention, the thickness of the self-assembled film can be regulated. In particular, the compound according to an embodiment of the present invention may include a thiol anchoring group. With respect to an anchoring group included in the compound according to an embodiment of the present invention, by selecting properly a molecular length and kind of substituted groups, a charge effect of an applied voltage between the two electrodes can be regulated. That is, a current intensity flowing along the longitudinal direction of the alkyl group can be regulated.

As described above, by forming the self-assembled molecular active layer including the compound of the present invention between the upper and lower electrodes using the above methods, a nano-scaled fine structure of a molecular electronic device having switching characteristics and memory characteristics can be implemented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A compound having a structure of the formula below:

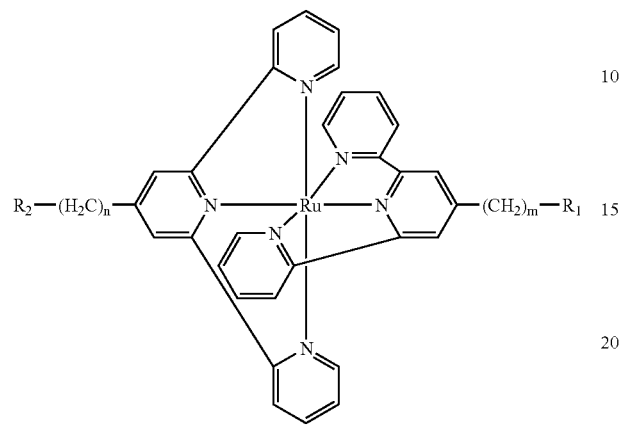

where $R_1$ and $R_2$ are independently a thioacetyl group or a hydrogen atom, at least one of $R_1$ and $R_2$ is a thioacetyl group, and m and n are independently integers from 1 to 20.

2. The compound of claim 1, wherein $R_1$ and $R_2$ are a thioacetyl group.

3. The compound of claim 1, wherein any one of $R_1$ and $R_2$ is a hydrogen atom.

4. A method of synthesizing a compound, of claim 1 the method comprising:
   preparing a first terpyridine compound including a thioacetyl group from 4'-methylthiolterpyridine or 4'-methylterpyridine; and
   reacting the first terpyridine compound and rutheniumtrichloride hydrate to synthesize the compound of claim 1.

5. The method of claim 4, wherein the preparing the first terpyridine compound comprises reacting 4'-methylthiolterpyridine and potassiumthioacetate.

6. The method of claim 4, wherein the preparing the first terpyridine compound comprises:
   lithiating a methyl group from 4'-methylterpyridine;
   reacting the lithiated resultant material and bromoalkane to form bromoalkylterpyridine; and
   reacting the bromoalkylterpyridine and potassiumthioacetate.

7. A method of synthesizing a compound, of claim 1 the method comprising:
   forming a first terpyridine compound comprising a thioacetyl group from 4'-methylthiolterpyridine or 4'-methylterpyridine;
   reacting a second terpyridine compound and rutheniumtrichloride hydrate to form terpyridinerutheniumtrichloride; and
   reacting the terpyridinerutheniumtrichloride and the first terpyridine compound to synthesize the compound of claim 1.

8. A molecular electronic device comprising: a first electrode; a second electrode formed on the first electrode; and a molecular active layer interposed between the first electrode and the second electrode, and wherein the molecular active layer comprises the compound of claim 1 self-assembled on the first electrode.

9. The molecular electronic device of claim 8, wherein the molecular active layer composes a switching element which is mutually switchable on states of ON and OFF according to voltages applied between the first electrode and the second electrode.

10. The molecular electronic device of claim 8, wherein the molecular active layer composes a memory element in which a predetermined electric signal is stored according to voltages applied between the first electrode and the second electrode.

11. The molecular electronic device of claim 8, wherein the molecular active layer is self-assembled on the first electrode using a thiol group of the compound for the molecular electronic device as an anchoring group.

12. The molecular electronic device of claim 8, wherein each of the first electrode and the second electrode comprises gold, platinum, silver or chromium.

* * * * *